United States Patent
Naruse et al.

(10) Patent No.: US 9,171,799 B2
(45) Date of Patent: Oct. 27, 2015

(54) PHOTOELECTRIC CONVERSION APPARATUS, IMAGE PICKUP SYSTEM, AND MANUFACTURING METHOD THEREFOR

(75) Inventors: Hiroaki Naruse, Yokohama (JP); Kenji Togo, Kawasaki (JP); Masatsugu Itahashi, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 1103 days.

(21) Appl. No.: 13/071,044

(22) Filed: Mar. 24, 2011

(65) Prior Publication Data
US 2011/0233620 A1    Sep. 29, 2011

(30) Foreign Application Priority Data

Mar. 25, 2010  (JP) ................................. 2010-070328
Mar. 14, 2011  (JP) ................................. 2011-055342

(51) Int. Cl.
| | | |
|---|---|---|
| H01L 27/148 | (2006.01) | |
| H01L 23/522 | (2006.01) | |
| H01L 27/146 | (2006.01) | |
| H04N 5/3745 | (2011.01) | |

(52) U.S. Cl.
CPC ...... *H01L 23/5226* (2013.01); *H01L 27/14603* (2013.01); *H01L 27/14629* (2013.01); *H01L 27/14636* (2013.01); *H01L 27/14638* (2013.01); *H01L 2924/0002* (2013.01); *H04N 5/3745* (2013.01)

(58) Field of Classification Search
CPC ..................... H01L 23/5226; H01L 27/14603; H01L 27/14629; H01L 27/14636; H01L 27/14638; H01L 2924/0002; H01L 2924/00; H04N 5/3745
See application file for complete search history.

(56) References Cited

U.S. PATENT DOCUMENTS

| | | | |
|---|---|---|---|
| 2008/0057615 A1* | 3/2008 | Okagawa et al. | ............... 438/73 |
| 2008/0083927 A1 | 4/2008 | Nishiura | |
| 2009/0140234 A1 | 6/2009 | Moniwa | |

FOREIGN PATENT DOCUMENTS

| | | |
|---|---|---|
| CN | 1716626 A | 1/2006 |
| CN | 101136367 A | 3/2008 |
| JP | 2003-204055 A | 7/2003 |
| JP | 2008-085304 A | 4/2008 |

OTHER PUBLICATIONS

U.S. Appl. No. 13/104,384, filed May 10, 2011, Shinya Ishikawa.
U.S. Appl. No. 13/106,755, filed May 12, 2011, Tomohisa Kinugasa.
U.S. Appl. No. 13/090,087, filed Apr. 19, 2011, Kenji Kubozono.
U.S. Appl. No. 13/040,172, Mar. 3, 2011, Hideo Kobayashi.

* cited by examiner

*Primary Examiner* — Hrayr A Sayadian
(74) *Attorney, Agent, or Firm* — Canon USA, Inc. IP Division

(57) ABSTRACT

A photoelectric conversion apparatus includes a semiconductor substrate on which a photoelectric conversion element and a transistor are arranged and a plurality of wiring layers including a first wiring layer and a second wiring layer above the first wiring layer, in which a connection between the semiconductor substrate and any of the plurality of wiring layers, between a gate electrode of the transistor and any of the plurality of wiring layers, or between the first wiring layer and the second wiring layer, has a stacked contact structure.

11 Claims, 13 Drawing Sheets

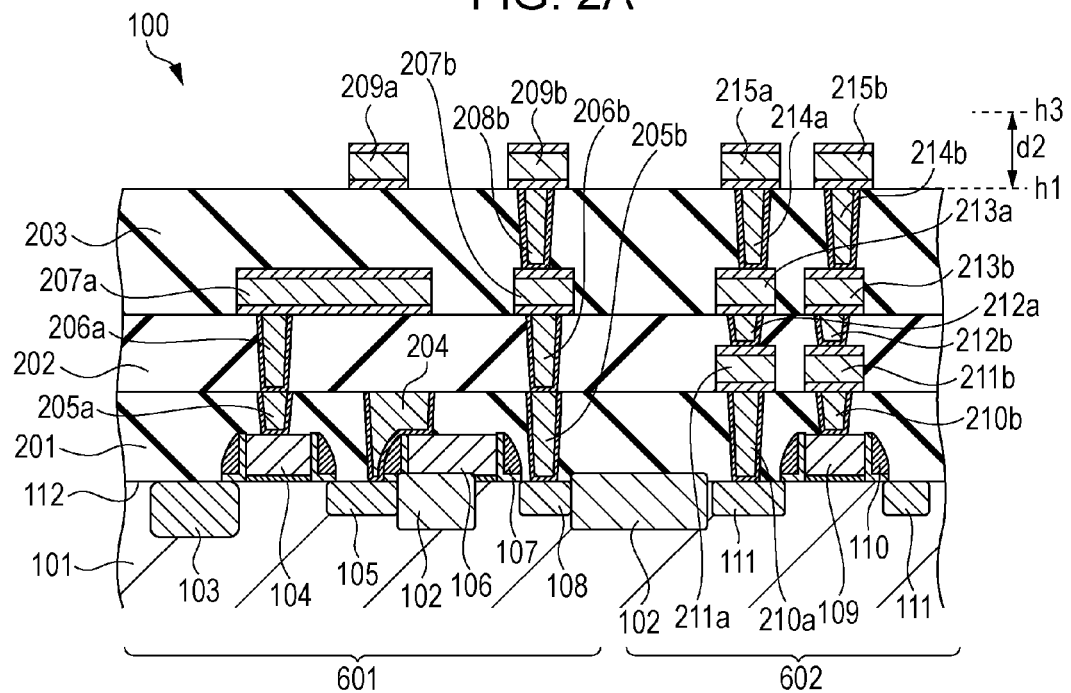
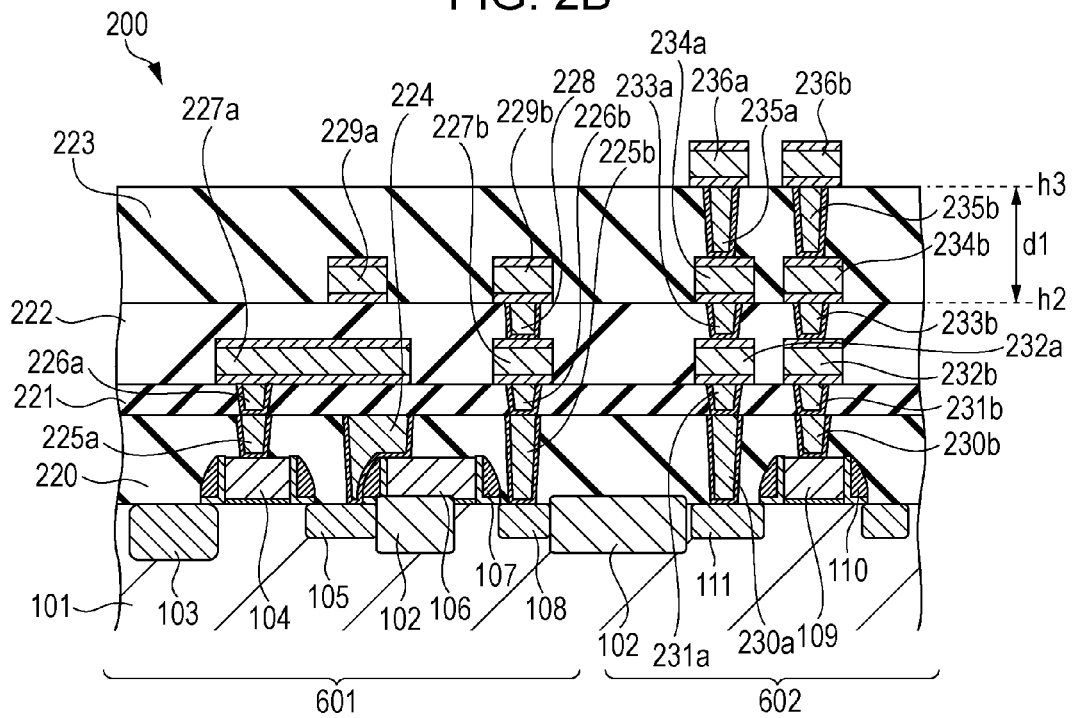

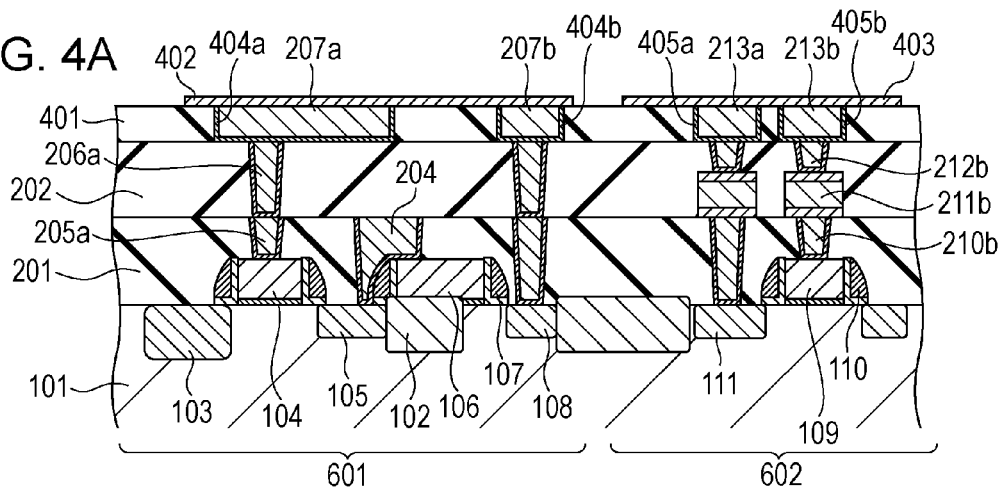
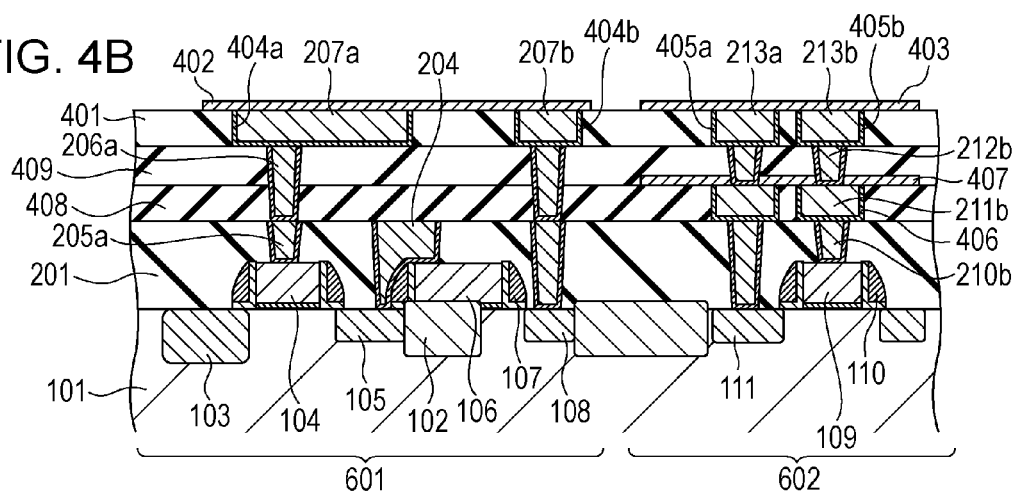
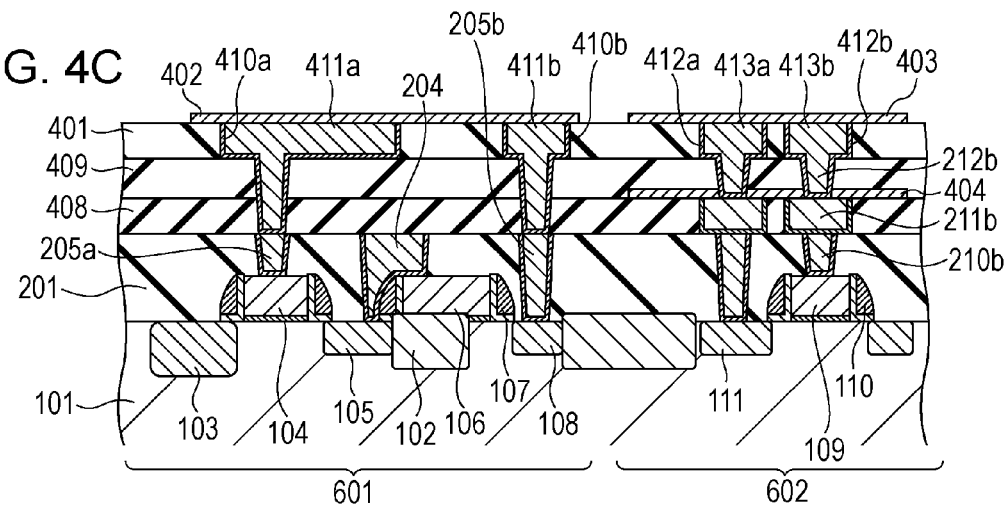

PHOTOELECTRIC CONVERSION APPARATUS, IMAGE PICKUP SYSTEM, AND MANUFACTURING METHOD THEREFOR

BACKGROUND OF THE INVENTION

1. Field of the Invention

The present invention relates to a photoelectric conversion apparatus and a manufacturing process therefor.

2. Description of the Related Art

A CMOS-type photoelectric conversion apparatus is widely used as an image pickup element for a digital camera or a digital video camera. In general, the CMOS-type photoelectric conversion apparatus is including a pixel area where pixels including photo diodes (PD) are arranged in a two-dimensional array manner and a peripheral circuit area arranged so as to surround the pixel area.

It is desirably for the CMOS-type photoelectric conversion apparatus to mount a larger number of pixels in a same area along with a recent year's increase in the number of pixels used in the digital camera or the digital video camera, and a size of one pixel in the CMOS-type photoelectric conversion apparatus continuously decreases.

Japanese Patent Laid-Open No. 2003-204055 illustrates a structure of a general CMOS-type photoelectric conversion apparatus. To realize the increase in the number of pixels, wiring layers electrically connecting the respective photo diodes with the transistors have multi-layer interconnection.

Japanese Patent Laid-Open No. 2008-85304 discloses a configuration in which, to secure a sensitivity with respect to incident light even when the pixel scales down, two types of contact structures are provided to an interlayer insulating layer in a wiring section of pixels of the CMOS-type photoelectric conversion apparatus in accordance with a target to be electrically connected. One of the two contact structures is for electrically connecting a semiconductor area with a gate electrode of an amplification MOS transistor without intermediation of the wiring layer. The other contact structure is for electrically connecting an active area and a gate electrode with the wiring layer by stacking a plurality of plugs.

At this point, due to a demand for a higher speed and a higher performance of the photoelectric conversion apparatus, a circuit scale of the entire photoelectric conversion apparatus is being larger. To satisfy this demand, a further miniaturization is required.

According to Japanese Patent Laid-Open No. 2003-204055, two layers of wiring layers including a first wiring layer and a second wiring layer from a side close to the semiconductor substrate, a first interlayer insulating film, and a second interlayer insulating film are provided. Also, in a case where an electric connection is established via two or more layers of interlayer insulating films like a connection from the second wiring layer to the semiconductor substrate, first, the second wiring layer and the first wiring layer are connected to each other via a second via arranged in the second interlayer insulating film. Furthermore, an electric connection between the first wiring layer and the semiconductor substrate is established via a first via arranged in the first interlayer insulating film. With regard to the above-mentioned configuration, the inventors of the present application find the following problem. First, in the above-mentioned configuration, it is necessary to secure an area for forming the first wiring layer used for connecting the first via with the second via, and it is difficult to realize the miniaturization of the first wiring layer. Also, for example, in a floating diffusion section of the CMOS type photoelectric conversion apparatus, in a case where the area of an opposing metal wiring is large, an electrostatic capacity between the floating diffusion section and the metal wiring becomes large. The problem of the increase in the electrostatic capacity has a larger influence as the miniaturization further advances because a distance between the floating diffusion section and the metal wiring is shortened. The above-mentioned increase in the capacitance of the floating diffusion section may cause a decrease in the signal charges generated through the photoelectric conversion.

SUMMARY OF THE INVENTION

A photoelectric conversion apparatus according to an aspect of the present invention includes: a semiconductor substrate on which a photoelectric conversion element and a transistor are arranged; and a plurality of wiring layers including a first wiring layer and a second wiring layer arranged above the first wiring layer, in which a connection between the semiconductor substrate and any of the plurality of wiring layers, between a gate electrode of the transistor and any of the plurality of wiring layers, or between the first wiring layer and the second wiring layer, has a stacked contact structure.

Also, a photoelectric conversion apparatus according to another aspect of the present invention includes: a semiconductor substrate having arranged thereon a pixel area where a plurality of pixels including a photoelectric conversion element and a transistor are arranged and a peripheral circuit area having a transistor and more wiring layers than the pixel area; and a wiring section that is arranged on the semiconductor substrate and has a plurality of interlayer insulating films including a first interlayer insulating film and a second interlayer insulating film arranged above the first interlayer insulating film and a plurality of wiring layers including a first wiring layer and a second wiring layer arranged above the first wiring layer, in which the wiring section has the first wiring layer and the plug that is connected to the first wiring layer and is arranged in the first interlayer insulating film in the peripheral circuit area, and the wiring section has the second wiring layer, the plug arranged in the first interlayer insulating film connected to the second wiring layer, and the plug arranged in the second interlayer insulating film in the pixel area, and in which the wiring layer arranged in closest proximity to the semiconductor substrate is the first wiring layer in the peripheral circuit area and is the second wiring layer in the pixel area.

Also, according to an aspect of the present invention, there is provided a manufacturing method for a photoelectric conversion apparatus that includes: a semiconductor substrate having arranged thereon a pixel area where a plurality of pixels including a photoelectric conversion element and a transistor are arranged and a peripheral circuit area having a transistor and more wiring layers than the pixel area; and a wiring section that is arranged on the semiconductor substrate and has a plurality of interlayer insulating films including a first interlayer insulating film and a second interlayer insulating film above the first interlayer insulating film and a plurality of wiring layers including a first wiring layer and a second wiring layer above an upper section of the first wiring layer, the manufacturing method including: forming the first interlayer insulating film above the semiconductor substrate; forming a plurality of plugs in the first interlayer insulating film; forming the first wiring layer connected to a part of the plurality of plugs formed in the first interlayer insulating film on the first interlayer insulating film in the peripheral circuit area; forming the second interlayer insulating film after the forming the first wiring layer; removing a part of the second interlayer insulating film and forming a hole for exposing a part of the plurality of plugs formed in the first interlayer insulating film in the pixel area and a hole for exposing a part of the first wiring layer in the peripheral circuit area in the second interlayer insulating film; filling the hole formed in the second interlayer insulating film with a conductive material and forming a plug in the second interlayer insulating film; and forming the second wiring layer on the second interlayer insulating film after the forming the plug in the second interlayer insulating film.

Further features of the present invention will become apparent from the following description of exemplary embodiments with reference to the attached drawings.

BRIEF DESCRIPTION OF THE DRAWINGS

FIGS. 2A and 2B are cross sectional schematic diagrams of the photoelectric conversion apparatus for describing the first embodiment.

FIGS. 4A to 4C are cross sectional schematic diagrams of a photoelectric conversion apparatus according to a second embodiment of the present invention.

DESCRIPTION OF THE EMBODIMENTS

A photoelectric conversion apparatus according to an aspect of the present invention relates to a photoelectric conversion apparatus including: a semiconductor substrate on which a photoelectric conversion element and a transistor are arranged; and a plurality of wiring layers including a first wiring layer and a second wiring layer arranged above the first wiring layer, in which a connection between the semiconductor substrate and any of the plurality of wiring layers, between a gate electrode of the transistor and any of the plurality of wiring layers, or between the first wiring layer and the second wiring layer has a stacked contact structure. With the provision of the above-mentioned structure, the increase in the capacitance of a floating diffusion section can be suppressed.

Also, the photoelectric conversion apparatus according to the aspect of the present invention has a pixel area and a peripheral circuit area on a semiconductor substrate and has a wiring section arranged on the semiconductor substrate. The wiring section has a first interlayer insulating film, a first wiring layer, a second interlayer insulating film, and a second wiring layer arranged in the stated order from the semiconductor substrate side. Furthermore, the wiring section has a plug arranged in the first interlayer insulating film connected to the first wiring layer in the peripheral circuit area and has a plug arranged in the first interlayer insulating film connected to the second wiring layer and a plug arranged in the second interlayer insulating film in the pixel area. Then, in the photoelectric conversion apparatus according to an aspect of the present invention, the wiring layer arranged in closest to the semiconductor substrate is the first wiring layer in the peripheral circuit area and the second wiring layer in the pixel area. With the provision of the above-mentioned structure, while the increase in the capacitance of the floating diffusion section is suppressed, a step between the pixel area and the peripheral circuit area is suppressed, and it is possible to increase the number of wiring layers in the peripheral circuit area.

Figure 6:
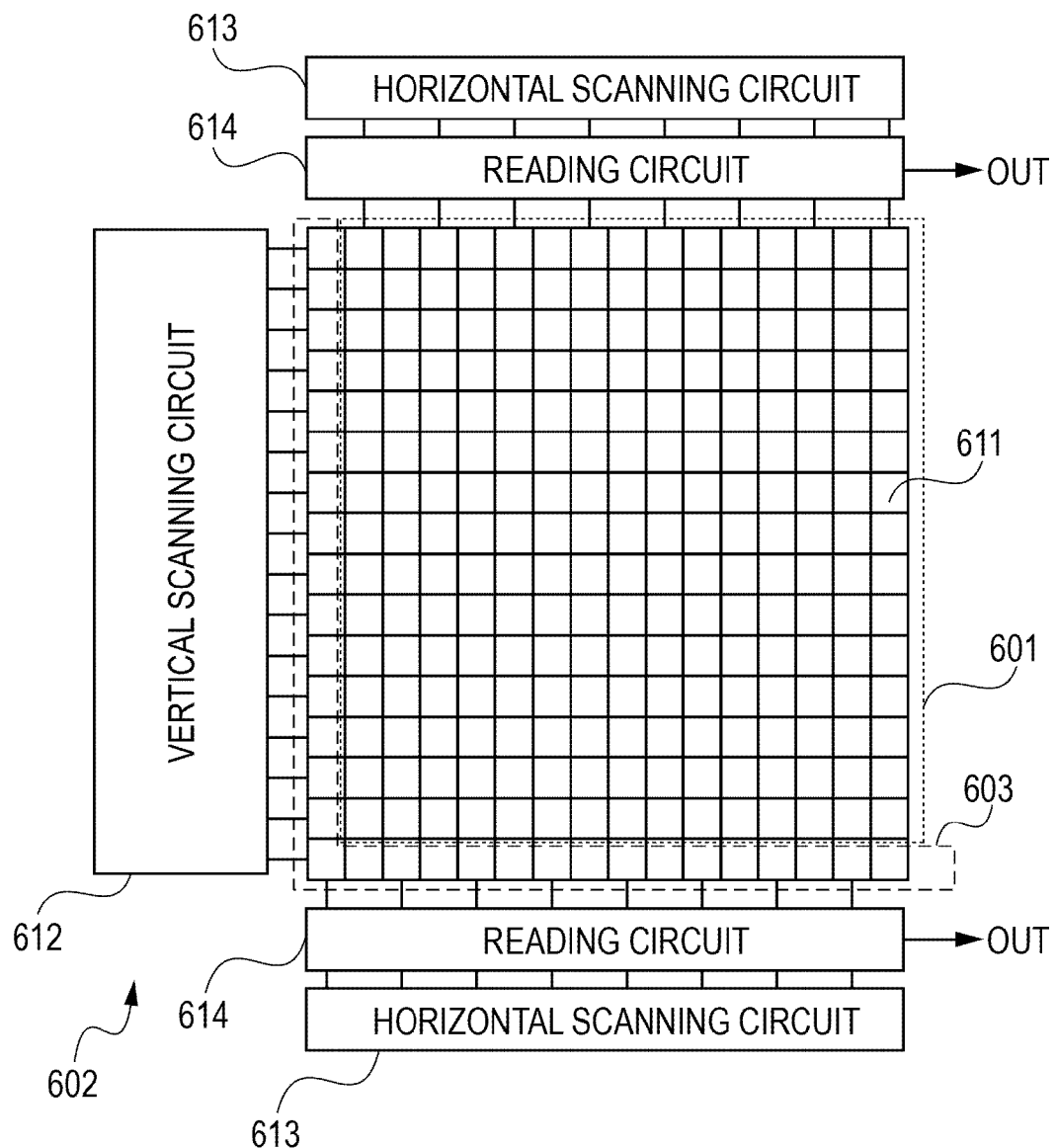
FIG. 6 is a plan schematic view of the photoelectric conversion apparatus.

The photoelectric conversion apparatus according to the aspect of the embodiments will be described. FIG. 6 is a plan schematic view of the photoelectric conversion apparatus according to the present invention. In FIG. 6, reference numeral 601 denotes a pixel area, and reference numeral 602 denotes a peripheral circuit area. The pixel area 601 includes an effective pixel area where pixels 611 including photoelectric conversion elements for obtaining picked-up image signals are arranged in a two-dimensional array manner. The peripheral circuit area 602 is an area other than the pixel area 601. In some embodiments, the peripheral circuit area 602 has more wiring layers than the pixel area 601. In FIG. 6, in the peripheral circuit area 602, a vertical scanning circuit 612 for reading out signals from the pixel area 601, horizontal scanning circuits 613 for processing and outputting the read out signals, readout circuits 614 including circuits for processing the read out signals, and the like may be arranged. The readout circuit 614 is an arbitrary circuit such as an amplification circuit, a correlated double sampling circuit, or an AD conversion circuit. The pixel area 601 and the peripheral circuit area 602 are integrated on a same semiconductor substrate. Also, in FIG. 6, an optical black area 603 for obtaining a reference signal having a pixel where light is shielded by a light shielding film.

Figure 5A:
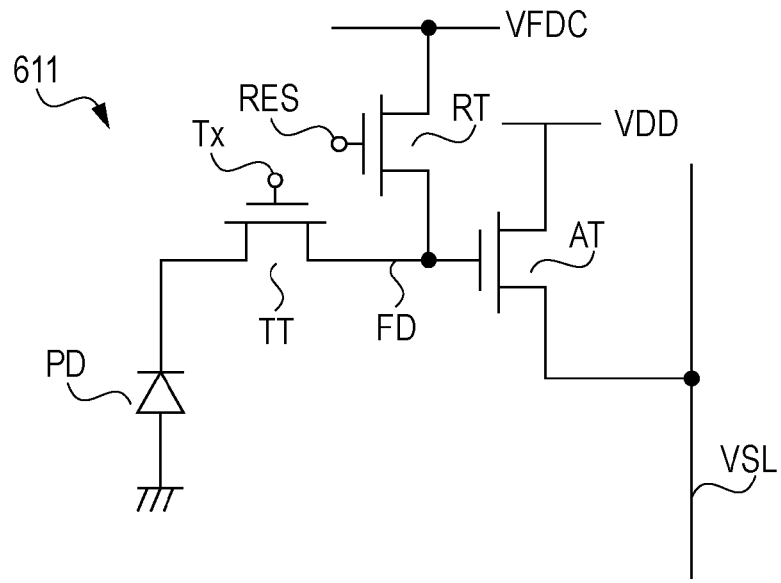
FIG. 5A is a circuit diagram of a pixel of the photoelectric conversion apparatus.

Next, a pixel circuit and a planar layout of the photoelectric conversion apparatus will be described by using FIGS. 5A and 5B. FIG. 5A is a circuit diagram of an exemplary pixel circuit of the photoelectric conversion apparatus. The pixel 611 has a photo diode PD that is a photoelectric conversion element, a transfer transistor TT, an amplification transistor AT, and a reset transistor RT. In FIG. 5A, the transfer transistor TT, the amplification transistor AT, and the reset transistor RT are NMOS transistors, and signal charges are electrons. In this configuration example, in the photo diode PD, an anode is grounded, and a cathode is connected to the transfer transistor TT. The amplification transistor AT is connected to a constant current circuit (not illustrated) and constitutes a source follower circuit. The photo diode PD has a charge accumulation section of a first conductivity type (in this configuration example, n-type). A node FD includes the floating diffusion section (FD section). The node FD is reset to a predetermined voltage as a gate of the reset transistor RT is applied with a reset pulse RES. At this predetermined potential, a selection state of the pixel and a non-selection state of the pixel are controlled. To be more specific, when the reset transistor RT is applied the reset pulse RES in a state in which a voltage VFDC at a drain of the reset transistor RT is set as a first voltage, the pixel is put in a selection state. On the other hand, when the reset transistor RT is applied with the reset pulse RES in a state in which the voltage VFDC at the drain of the reset transistor RT is set as a second voltage, the pixel is put in the non-selection state. The first voltage is a voltage for turning the amplification transistor AT in an ON state, and the second voltage is a voltage for turning the amplification transistor AT in an OFF state. Also, as a gate of the transfer transistor TT is applied with a transfer pulse Tx, the signal charges accumulated in the charge accumulation section are transferred to the node FD. The voltage at the node FD changes in accordance with the amount of the transferred the signal charges. On the basis of the selection and non-selection operations by the reset transistor RT and the transfer operation by the transfer transistor TT, the signal in accordance with the voltage at the node FD is output from the amplification transistor AT to a vertical output line VSL.

Figure 5B:
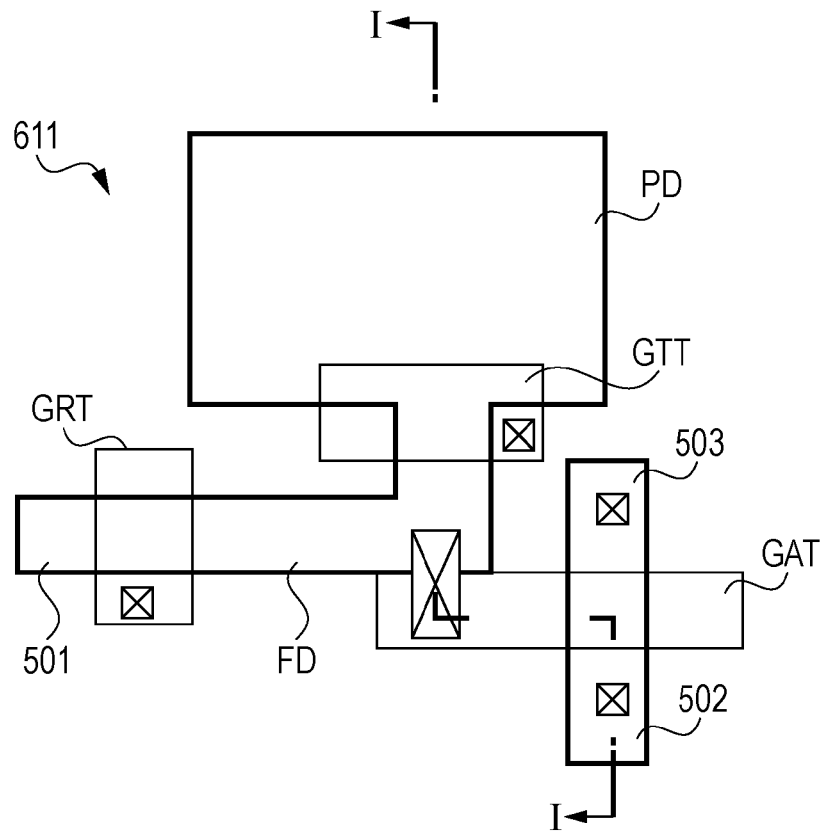
FIG. 5B is a plan schematic view of the pixel of the photoelectric conversion apparatus.

FIG. 5B is a planar layout diagram of the pixel circuit illustrated in FIG. 5A. In FIG. 5B, a gate electrode GTT of the transfer transistor is arranged between the photo diode PD and an FD section 105. Also, a gate electrode GRT of the reset transistor is arranged between the FD section 105 and a drain 501 of the reset transistor. Herein, as described above, the FD section 105 is also a drain of the transfer transistor TT and a source of the reset transistor RT. Then, a gate electrode GAT of the amplification transistor is arranged between a source 502 and a drain 503 of the amplification transistor. The gate electrode GAT of the amplification transistor is connected to the FD section 105 via a shared contact. At this time, the gate electrode GAT of the amplification transistor extends from the FD section 105 to the amplification transistor and doubles as a wiring that connects the FD section 105. It is noted that in FIG. 5B, a section with an X-mark surrounded by a square represents a contact.

Hereinafter, on the basis of the pixel 611 described above, the photoelectric conversion apparatus according to the present invention will be described. It is noted that the pixel circuit or the planar layout of the present invention is not limited to the configuration illustrated in FIGS. 5A and 5B, and also, a configuration having a selection transistor may also be adopted.

First Embodiment

Figure 1:
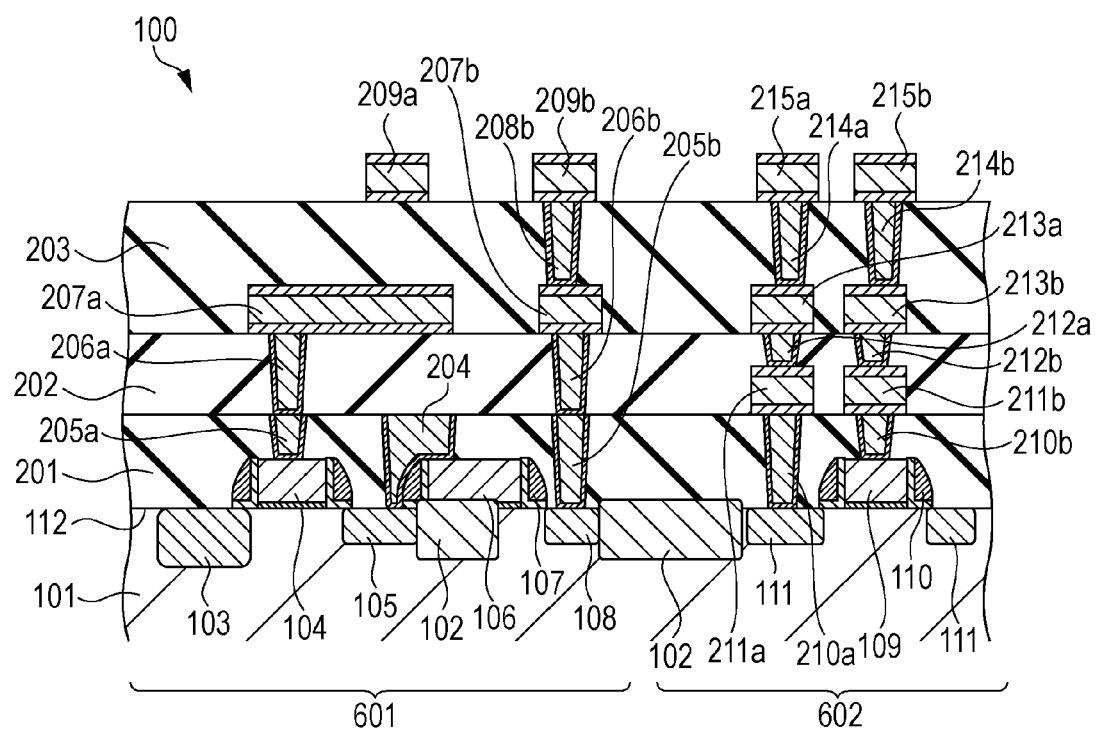
FIG. 1 is a cross sectional schematic diagram of a photoelectric conversion apparatus according to a first embodiment of the present invention.

The photoelectric conversion apparatus according to the present embodiment will be described by using FIG. 1. FIG. 1 is a cross sectional schematic diagram illustrating a part of the pixel area 601 and a part of the peripheral circuit area 602. A cross sectional view of a part of the pixel area 601 in FIG. 1 is a cross section cut by the I-I line in FIG. 5B, and a cross sectional view of a part of the peripheral circuit area 602 is a cross section of an arbitrary transistor provided to the peripheral circuit area 602. In FIG. 1, the same configuration as FIG. 5B is assigned with the same reference numeral, and a description thereof will be omitted. Also, the pixel area 601 and the peripheral circuit area 602 of FIG. 1 are illustrated to be adjacent to each other for the description.

In the pixel area 601 of FIG. 1, an element separation 102 such as LOCOS, an n-type charge accumulation section 103 constituting a photo diode, a gate electrode 104 of the transfer transistor, and the FD section 105 are arranged. Furthermore, in the pixel area 601, a gate electrode 106 of the amplification transistor, a side wall 107 of the transistor in the pixel area, and a source/drain 108 of the transistor in the pixel area are arranged. Then, in the peripheral circuit area 602 of FIG. 1, for example, transistors constituting the readout circuit 614 of FIG. 6 are arranged. The transistor includes a gate electrode 109, a side wall 110, and a source/drain 111.

In the pixel area 601 and the peripheral circuit area 602 of FIG. 1, a wiring section is arranged on a main surface 112 of a semiconductor substrate 101. The wiring section has a plurality of interlayer insulating films, a plurality of plugs, and a plurality of wiring layers in the pixel area 601 and the peripheral circuit area 602. The plurality of interlayer insulating films include at least a first interlayer insulating film 201, a second interlayer insulating film 202, and a third interlayer insulating film 203. The first interlayer insulating film 201, the second interlayer insulating film 202, and the third interlayer insulating film 203 are arranged in the stated order on the main surface 112 from the main surface 112 in FIG. 1. The plurality of plugs include plugs 204, 205, and 210 arranged in the first interlayer insulating film 201, plugs 206 and 212 arranged in the second interlayer insulating film 202, and plugs 208 and 214 arranged in the third interlayer insulating film 203. The plurality of wiring layers have a first wiring layer arranged on the first interlayer insulating film 201, a second wiring layer arranged on the second interlayer insulating film 202, and a third wiring layer arranged on the third interlayer insulating film 203. The respective wiring layers represent an aggregate of wirings formed in an equal height or formed through a same step and have a plurality of wirings. The first wiring layer includes a wiring 211, the second wiring layer includes wirings 207 and 213, and the third wiring layer includes wirings 209 and 215. Herein, in a case where each of the plurality of arranged plugs 205 is illustrated, reference symbols 205a and 205b are used, and in a case where each of the plurality of arranged wirings 211 is illustrated, reference symbols 211a and 211b are used. Other configurations are also illustrated similarly.

In the pixel area 601, the plug 204 and the plug 205 arranged in the first interlayer insulating film 201 are connected to an element arranged on the semiconductor substrate 101. The plug 205 is connected to the plug 206 arranged in the second interlayer insulating film 202, and the plug 206 is connected to the plug 205 and the second wiring layer 207 arranged on the second interlayer insulating film 202. The wiring 207b that is a part of the second wiring layer is connected to the plug 208b arranged in the third interlayer insulating film 203, and the plug 208b is connected to the wiring 209b that is a part of the third wiring layer arranged on the third interlayer insulating film 203. At this time, the plug 204 arranged in the first interlayer insulating film 201 has a shared contact structure for electrically connecting the FD section 105 with the gate electrode 106 of the amplification transistor without the intermediation of the wiring. Also, the plug 205 arranged in the first interlayer insulating film 201 and the plug 206 arranged in the second interlayer insulating film 202 have a lamination structure (stacked contact structure). The plug 205 and the plug 206 electrically connect the gate electrode 104 of the transfer transistor, a source/drain 108 of the amplification transistor, and the wiring of the second wiring layer 207 arranged on an upper section thereof. To elaborate, the connection among the gate electrode 104 of the transfer transistor, a source/drain 108 of the amplification transistor, and the wiring of the second wiring layer 207 has a stacked contact structure.

Next, in the peripheral circuit area 602, the plug 210 arranged in the first interlayer insulating film 201 is connected to an element arranged on the semiconductor substrate 101. The plug 210 is connected to the wiring 211 of the first wiring layer arranged on the first interlayer insulating film 201, and the wiring 211 of the first wiring layer is connected to the plug 212 arranged in the second interlayer insulating film 202. The wiring 213 of the second wiring layer arranged on the second interlayer insulating film 202 is electrically connected to the wiring 211 of the first wiring layer via the plug 212. The wiring 213 of the second wiring layer is electrically connected to the wiring 215 of the third wiring layer arranged on the third interlayer insulating film 203 via the plug 214 arranged in the third interlayer insulating film 203. The stacked contact structure is not arranged in the peripheral circuit area 602.

Herein, the first wiring layer is not arranged in the pixel area 601 but is arranged only in the peripheral circuit area 602 and becomes a wiring layer arranged in closest proximity to the semiconductor substrate in the peripheral circuit area 602. With the above-mentioned configuration in which the first wiring layer is not arranged in the vicinity of the FD section 105, it is possible to suppress the increase in the capacitance of the FD section.

Herein, the wirings of the second wiring layer are arranged in the pixel area 601 and the peripheral circuit area 602. In the pixel area 601 where the first wiring layer is not arranged, the second wiring layer becomes the wiring layer arranged in closest proximity to the semiconductor substrate. To elaborate, heights of the wiring arranged in closest proximity to the semiconductor substrate differ from each other in the pixel area 601 and the peripheral circuit area 602. Herein, the height is a height from a main surface 122 of the semiconductor substrate. To be more specific, the wiring 211 arranged in closest proximity to the semiconductor substrate in the peripheral circuit area 602 is arranged at a location lower than the wiring 207 arranged in closest proximity to the semiconductor substrate in the pixel area from the semiconductor substrate 101. Then, the wiring 207 arranged in closest proximity to the semiconductor substrate 101 in the pixel area 601 and the wiring 213 arranged in the second layer from the semiconductor substrate 101 in the peripheral circuit area 602 have the equal height from an upper surface 112 of the semiconductor substrate. Therefore, it is understood that the peripheral circuit area 602 has more wiring layers from the main surface 112 of the semiconductor substrate to the above-mentioned equal height. With the above-mentioned configuration, even in a configuration in which the number of wiring layers of the peripheral circuit area 602 is large, the step with the pixel area 601 can be reduced, and it is possible to suppress the increase in the thickness of the interlayer insulating file in the pixel area 601.

Also, In FIG. 1, the first wiring layer is arranged above the plugs 204 and 205 in the pixel area 601 and arranged at the equal height as the plug 206. In FIG. 1, a bottom surface of the wiring 211 and a bottom surface of the plug 206 are arranged at an equal height, but the mutual bottom surfaces may not be necessarily arranged at an equal height. At least, the wiring 211 and the plug 206 are arranged at an equal height. Also, when a comparison is made on the plug 206 and the plug 212 arranged in the second interlayer insulating film 202, a length of the plug 212 is shorter because of the arrangement of the first wiring layer. With the provision of the above-mentioned short plug 212, the wiring 207 and the wiring 213 of the second wiring layer can be arranged at an equal height.

Next, a reduction in the film thickness of the interlayer insulating film of the photoelectric conversion apparatus according to the present embodiment will be described by using FIGS. 2A and 2B. FIG. 2A is a cross sectional schematic diagram of the photoelectric conversion apparatus of FIG. 1, and FIG. 2B is a cross sectional schematic diagram of a photoelectric conversion apparatus based on the configuration described in Japanese Patent Laid-Open No. 2003-204055 for a comparison. In FIGS. 2A and 2B, a comparison is made on structures having the same number of wiring layers in the pixel area and the peripheral circuit area in the same circuit. Hereinafter, in FIGS. 2A and 2B, a configuration corresponding to FIG. 1 is assigned with the same reference numeral, and a description thereof will be omitted. A photoelectric conversion apparatus 200 of FIG. 2B has a structure different from a photoelectric conversion apparatus 100 of FIG. 2A in terms of the structure of the wiring section in the peripheral circuit area 602 in particular. Here, the wiring section of FIG. 2B will be described. The wiring section of FIG. 2B will be described by using names similar to those in FIG. 2A for comparison.

The wiring section of FIG. 2B has the plurality of interlayer insulating films, the plurality of plugs, and the plurality of wiring layers. The plurality of interlayer insulating films have a first interlayer insulating film 220, a second interlayer insulating film 221, a third interlayer insulating film 222, and a fourth interlayer insulating film 223 arranged in the stated order from the semiconductor substrate 101 side. The plurality of plugs have the plugs 224, 225, and 230 in the first interlayer insulating film 220, the plugs 226 and 231 in the second interlayer insulating film 221, the plugs 228 and 233 in the third interlayer insulating film 222, and the plug 235 in the fourth interlayer insulating film 223. The plurality of wiring layers have the first wiring layer arranged on the second interlayer insulating film 221, the second wiring layer arranged on the third interlayer insulating film 222, and the third wiring layer arranged on the fourth interlayer insulating film 223. The first wiring layer has the wirings 227 and 232, the second wiring layer has the wirings 229 and 234, and the third wiring layer has the wiring 236.

The plugs 224, 225, and 230 arranged in the first interlayer insulating film 220 are connected to the element of the semiconductor substrate 101. Herein, the plug 225 arranged in the first interlayer insulating film 220 of the pixel area 601 is connected to the plug 226 arranged in the second interlayer insulating film 221 to construct the stacked contact structure. Then, the plug 230 arranged in the first interlayer insulating film 220 of the peripheral circuit area 602 is connected to the plug 231 arranged in the second interlayer insulating film 221 to construct the stacked contact structure. It is noted that the plug 224 similarly has the shared contact structure as in FIG. 2A. Then, the plug 226 of the pixel area 601 is connected to the wiring 227 of the first wiring layer arranged on the second interlayer insulating film 221, and the plug 230 of the peripheral circuit area 602 is connected to the wiring 232 of the first wiring layer arranged on the second interlayer insulating film 221. After that, the wiring 227b that is a part of the first wiring layer of the pixel area 601 is electrically connected to the wiring 229b that is a part of the second wiring layer arranged on the third interlayer insulating film 222 via the plug 226b arranged in the third interlayer insulating film 222. The wiring 232 of the first wiring layer in the peripheral circuit area 602 is electrically connected to the wiring 234 of the second wiring layer arranged on the third interlayer insulating film 222 via the plug 233 arranged in the third interlayer insulating film 222. Then, the wiring 234 of the second wiring layer in the peripheral circuit area 602 is electrically connected to the wiring 236 of the third wiring layer on the fourth interlayer insulating film 223 via the plug 235 arranged in the fourth interlayer insulating film 223.

Here, a comparison is made on heights in the layers in the photoelectric conversion apparatus 100 of FIG. 2A and the photoelectric conversion apparatus 200 of FIG. 2B. In the photoelectric conversion apparatus 100, the uppermost wiring layer in the pixel area 601 (the wiring 209 of the third wiring layer) and the uppermost wiring layer in the peripheral circuit area 602 (the wiring 215 of the third wiring layer) are arranged at an equal height h1. Then, it is understood that no step exists between the pixel area 601 and the peripheral circuit area 602. On the other hand, in the photoelectric conversion apparatus 200, the uppermost wiring layer in the pixel area 601 (the wiring 229 of the second wiring layer) is arranged at a height h2, and the uppermost wiring layer in the peripheral circuit area 602 (the wiring 236 of the third wiring layer) is arranged at a height h3. Herein, the interlayer insulating film is arranged on the photoelectric conversion element of the photoelectric conversion apparatus 100 at a thickness corresponding to the height h1, and the interlayer insulating film is arranged on the photoelectric conversion element of the photoelectric conversion apparatus 200 at a thickness corresponding to a height h3. Therefore, the interlayer insulating film arranged on the photoelectric conversion element of the photoelectric conversion apparatus 100 is thinner by a difference d2 as compared with the photoelectric conversion apparatus 200. The difference d2 is a height corresponding to one plug. For example, in a wiring processing at 130 nm, in a case where the height to h3 is approximately 2.4 μm, d2 is approximately 0.30 μm, and approximately 10 to 20% of the height up to the height h3 can be made thinner. Therefore, while the increase in the film thickness of the interlayer insulating film is suppressed, the photoelectric conversion apparatus 100 according to the present embodiment can realize the increase in the number of layers for the wiring layers in the peripheral circuit area 602.

Also, in FIGS. 2A and 2B, in a case where the interlayer insulating film arranged in the pixel area for the wiring layers in the peripheral circuit area is removed, in the photoelectric conversion apparatus 200 of FIG. 2B, a large step d1 is generated between the pixel area 601 and the peripheral circuit area 602. If such a step is generated, in a subsequent procedure, for example, in a case where a color filter is formed or a case where a lens is formed, shape variations may occur due to the step. Also, it may be necessary to provide a flattening layer for flattening the step to curb the shape variations. Furthermore, the film thickness of the flattening layer needs to be increased. However, with the photoelectric conversion apparatus 100 according to the present embodiment, even in a case where the interlayer insulating film in the pixel area is removed, the step with the peripheral circuit area can be curbed. Also in a case where the peripheral circuit area has more wiring layers than the pixel area does, it is possible to eliminate the step corresponding to one layer of the wiring layers.

Next, by using FIGS. 3A to 3E, an exemplary manufacturing method for the photoelectric conversion apparatus of FIG. 1 will be described. The reference symbols of FIGS. 3A to 3E correspond to those of FIG. 1, and a description of the configuration assigned with the same reference numeral will be omitted.

First, the element separation section 102 is formed on the semiconductor substrate 101 by using a general semiconductor process. After that, for example, the gate electrodes 104, 106, and 109 of the transistor made of polysilicon are formed. The charge accumulation section 103 of the photo diode and a semiconductor area (not illustrated) for forming an LDD structure are formed through ion injection. Then, the side walls 107 and 110 are formed on the gate electrode. After that, the sources and drains 108 and 111 or the FD section 105 are formed through ion injection. The first interlayer insulating film 201 made of a silicon dioxide film is formed on the thus formed element to obtain a structure illustrated in FIG. 3A.

Figure 3A:
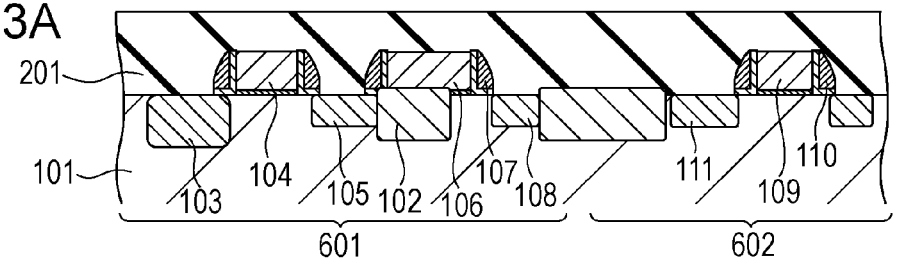
FIGS. 3A to 3E are cross sectional schematic diagrams illustrating a manufacturing procedure for the photoelectric conversion apparatus according to the first embodiment.
Figure 3B:
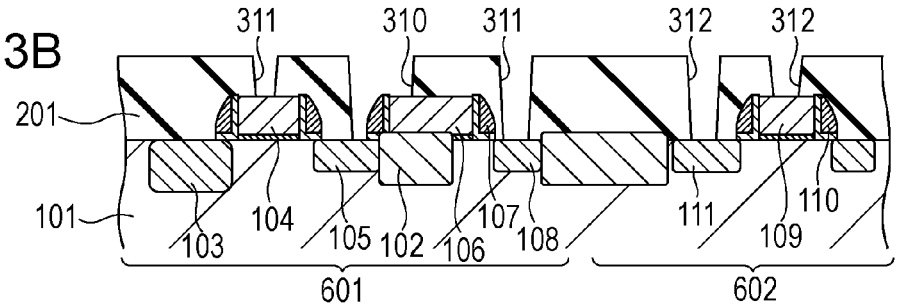

Next, photoresist is applied on the first interlayer insulating film 201, and the photoresist is subjected to patterning through photolithography to form a photoresist mask. Etching is performed on the first interlayer insulating film 201 by using the photoresist mask, and contact holes 310, 311, and 312 for the respective plugs illustrated in FIG. 1 are formed in the first interlayer insulating film 201. When the photoresist mask is removed, a configuration illustrated in FIG. 3B is obtained. Herein, the contact hole 310 for the shared contact structure exposes the FD section 105 and the gate electrode 106 of the amplification transistor.

Figure 3C:
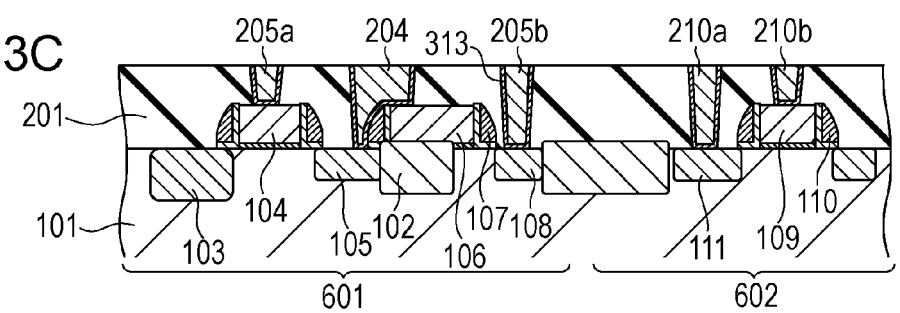

Next, a barrier metal film including a single layer or a laminated film of titanium or titanium nitride, for example, is formed in the respective contact holes 310, 311, and 312. For the barrier metal film, in addition to the above, it is possible to use a film containing titanium, tantalum, silicon, tungsten, or the like. Subsequently, a metal film for forming a plug including, for example, a tungsten film is formed. The barrier metal film is covered by the metal film. Then, through a CMP method or an etching method, these films excepted for the parts embedded in the respective contact holes are removed. After the removal, the plugs 204, 205, and 210 having a barrier metal 313 are formed, and a configuration illustrated in FIG. 3C is obtained.

Figure 3D:
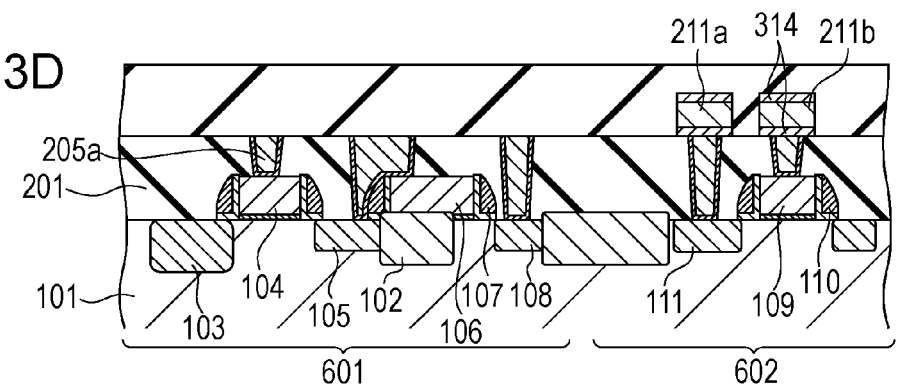

Next, the wiring layer is formed. A barrier metal film, a wiring material film including, for example, aluminum, and a barrier metal film are laminated in the stated order. Then, the resist pattern formed by the photolithography is used as a mask, and etching is performed on these films, and the wiring 211 of the first wiring layer and a barrier metal 314 thereof are formed. By covering an upper section thereof, the second interlayer insulating film 202 including, for example, a silicon oxide film is formed, the flattening processing is performed, and a structure illustrated in FIG. 3D is obtained. At this time, a material and an etching condition are desirably set so that an etching selectivity of the barrier metal 314 of the plug arranged in the first interlayer insulating film 201 and an etching selectivity of the metal film of the plug arranged in the first interlayer insulating film 201 become larger than that of the barrier metal 314 of the first wiring layer. This is because, when the wiring 211 of the first wiring layer is formed, the plug arranged in the first interlayer insulating film 201 below the wiring 211 is not to be subjected to etching or the etched amount is to be decreased.

Figure 3E:
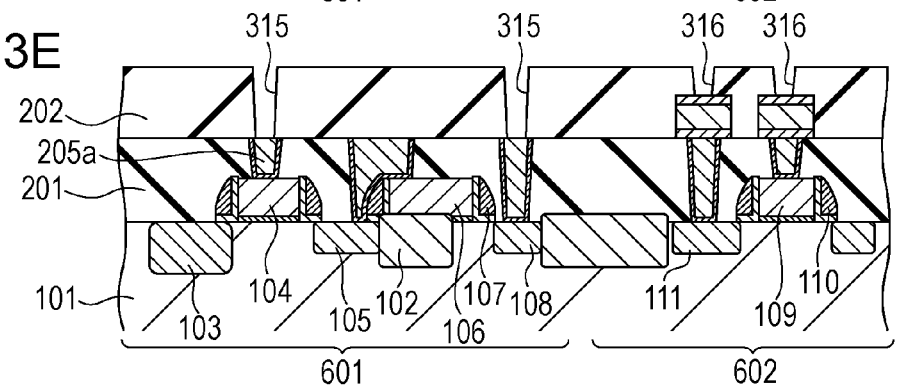

Next, a mask by the photoresist pattern is formed on the second interlayer insulating film 202, etching is performed on the second interlayer insulating film 202, the photoresist pattern is removed, and a configuration illustrated in FIG. 3E is obtained. In FIG. 3E, a via hole 315 for exposing an upper surface of the plug 205 is formed on the plug 205 in the pixel area 601. A via hole 316 for exposing an upper surface of the wiring 211 is formed on the wiring 211 of the first wiring layer in the peripheral circuit area 602. Although the via holes 315 and 316 have mutually different depths, the wiring 211 and the plug 205 function as an etching stop layer, and it is therefore possible to perform the simultaneous formation through etching. Then, the plug 206 and the plug 212 illustrated in FIG. 1 for formed through the formation procedure for the plug including the formation procedure for the barrier metal which is similar to that for the plug arranged in the first interlayer insulating film 201 illustrated in FIG. 3C. After that, the wiring 207 and the wiring 213 of the second wiring layer illustrated in FIG. 1 are formed on the second interlayer insulating film 202 through a procedure similar to that for the wiring 211. Then, similarly as in the procedure so far, the third interlayer insulating film 203 illustrated in FIG. 1 is formed, the plug 208 and the plug 214 are formed, and the wiring 209 and the wiring 215 of the third wiring layer are formed, so that the structure of FIG. 1 is obtained.

After that, when requested, a plug, a wiring layer, and an interlayer insulating film may further formed. Then, although not illustrated in FIG. 1 or the like, the photoelectric conversion apparatus is completed by further arranging a passivation film, a color filter, and a micro lens.

With the photoelectric conversion apparatus according to the present embodiment, while the increase in the capacitance of the FD section is suppressed, the increase in the film thickness of the interlayer insulating film is suppressed, and it is possible to arrange more wiring layers in the peripheral circuit area than in the pixel area. Also, the step between the peripheral circuit area and the pixel area can be reduced.

Also, In FIG. 1, the wiring 207a that is a part of the first wiring layer is arranged on the first plug 204 having the shared contact structure and an upper section of the FD section 105 while overlapping as viewed in a planar manner. As a part of the wirings of the first wiring layer arranged in closest proximity to the semiconductor substrate 101 in the pixel area 601 covers the FD section 105, a light shielding effect of the FD section 105 is improved, and interfusion of the light into the FD section 105 can be reduced. Herein, the planar manner means a planar layout when seeing the main surface 112 from above in a direction perpendicular to the main surface 112 of the semiconductor substrate. With the above-mentioned configuration, the light shielding effect of the FD section is improved, and the quality of the obtained image signal can be improved.

At this time, in a case where the optical black area 603 illustrated in FIG. 6 has the same number of the wiring layers including a light shielding film as the pixel area 601, it is possible to provide the wiring section having a structure similar to the pixel area 601 of FIG. 1. Also, in a case where the optical black area 603 illustrated in FIG. 6 has a larger layer number of the wiring layers including the light shielding film than the pixel area 601, it is possible to provide the wiring section having a structure similar to the peripheral circuit area 602 of FIG. 1. It is noted that the photoelectric conversion apparatus may not be provided with the optical black area 603 illustrated in FIG. 6.

Second Embodiment

The present embodiment relates to a configuration in which various types of damascene structures are applied to the wiring layer according to the first embodiment. The present embodiment will be described by using FIGS. 4A to 4C. FIGS. 4A to 4C are cross sectional schematic diagrams of the photoelectric conversion apparatus. FIGS. 4A to 4C illustrate a configuration corresponding to a section between the semiconductor substrate 101 of FIG. 1 and the wiring 207 and the wiring 213 of the second wiring layer. In FIGS. 4A to 4C, a configuration similar to that in FIG. 1 is assigned with the same reference numeral, and a description thereof will be omitted. With the provision of the wiring layer and the plug having the damascene structure according to the present embodiment, it is possible to form the fine wiring (in terms of both the width and the thickness). Also, in a dual damascene structure, as the wiring layer and the plug are formed in the same step, it is possible to decrease the thickness of the interlayer insulating film by an amount corresponding to a process margin necessarily provided for each step. For example, when the height h3 up to in the 130 nm process rule is set as approximately 2.4 µm, the margin in the case of forming the plug is approximately 3% thereof. Therefore, with the photoelectric conversion apparatus according to the present embodiment, it is possible to decrease the thickness of the interlayer insulating film as compared with the photoelectric conversion apparatus according to the first embodiment.

First, in the photoelectric conversion apparatus of FIG. 4A, the wiring 207 of the second wiring layer in the pixel area 601 and the wiring 213 of the second wiring layer in the peripheral circuit area 602 have a single damascene structure. The wiring 213 is formed through a single damascene method. An upper surface of the wiring 213 forms the same surface as an upper surface of the second interlayer insulating film 202. The wiring 207 and the wiring 213 of the second wiring layer having the single damascene structure contain copper as a conductive material and are so-called copper wirings. Then, copper diffusion prevention films 402 and 403 are arranged above the wiring 207 and the wiring 213.

A different part from the first embodiment on the manufacturing method for the photoelectric conversion apparatus of FIG. 4A will be described. Similarly as in the first embodiment, after up to the plug 206 and the plug 212 are formed, the interlayer insulating film 401 is formed on the second interlayer insulating film 202. Then, wiring grooves for the first wiring layer and a fourth wiring layer are formed in the interlayer insulating film 401 through etching or the like. Next, a film made of the barrier metal such as titanium nitride is formed so that an inner wall of the wiring groove is covered and an upper surface of the interlayer insulating film 401 is covered. After that, a film of copper is formed. The film of copper covers the upper surface of the interlayer insulating film 401 where the film made of the barrier metal is formed. And the film of copper buries the wiring groove in which the film made of the barrier metal is arranged. The film made of the barrier metal and the film made of copper formed in sections other than the wiring groove are removed through CMP or the like, and a copper wiring is formed. Finally, a copper diffusion prevention film made of a silicon nitride film is formed so as to cover the top of the copper wiring, and when requested, the diffusion prevention film is patterned, so that the configuration of the photoelectric conversion apparatus of FIG. 4A is obtained. After this, the wiring layer and the plug may be formed until a desired configuration is obtained.

In the photoelectric conversion apparatus of FIG. 4B, in addition to the configuration of FIG. 4A, the wiring 211 of the first wiring layer has the single damascene structure.

The manufacturing method of FIG. 4B is almost similar to FIG. 4A. To be more specific, after the formation of the plugs 204, 205, and 210 arranged in the first interlayer insulating film 201, the interlayer insulating film 408 is formed on the first interlayer insulating film 201. The wiring groove for the first wiring layer is formed in the interlayer insulating film 408 through etching or the like. Then, the film made of the barrier metal such as titanium nitride is formed so that the inner wall of the wiring groove is covered and an upper surface of the interlayer insulating film 408 is covered. After that, the film made of copper is formed. The wiring groove where the film made of the barrier metal is arranged is buried by the film of copper. And an upper surface of the interlayer insulating film 408 where the film made of the barrier metal is formed is covered by the film of copper. The film made of the barrier metal and the film made of copper formed in sections other than the wiring groove are removed through CMP or the like, the wiring 211 of the copper wiring is formed. Then, a diffusion prevention film 407 is formed on the wiring 211, and an interlayer insulating film 409 covering the diffusion prevention film 407 and the interlayer insulating film 408 is formed. After that, similarly as in the first embodiment, the plugs 206 and 212 are formed, and the second wiring layer illustrated in FIG. 4A is formed, so that the photoelectric conversion apparatus illustrated in FIG. 4B is obtained.

Next, in the photoelectric conversion apparatus of FIG. 4C, the wiring 211 of the first wiring layer has the single damascene structure like FIG. 4B. Then, in the photoelectric conversion apparatus of FIG. 4C, the wiring 207 of the second wiring layer and the plug 206 in FIG. 4B have the dual damascene structure. Also, the wiring 213 and the plug 212 have the dual damascene structure.

The manufacturing method of FIG. 4C is as follows. First, similarly as in FIG. 4B, after the wiring 211 of the first wiring layer and a diffusion prevention film 404 are formed, the interlayer insulating film 409 is formed, and the interlayer insulating film 401 is formed. Then, a continuous groove for the wiring and the plug is formed at an arbitrary location of the interlayer insulating films 409 and 401 through a photolithography technology and etching. When the groove for the wiring and the plug is formed through etching, for example, it is possible to form the interlayer insulating film 409 and the interlayer insulating film 401 by films made of different materials by utilizing an etching selectivity between the interlayer insulating film 409 and the interlayer insulating film 401. Then, the film made of the barrier metal such as titanium nitride is formed so that inner wall of the groove for the wiring and the plug is covered and the upper surface of the interlayer insulating film 401 is covered. Then, the film made of copper is formed so as to cover the upper surface of the interlayer insulating film 401 where the film made of the barrier metal is formed and to bury the groove for the wiring and the plug where the film made of the barrier metal is arranged. Next, the film made of the barrier metal and the film made of copper formed in sections other than the groove for the wiring and the plug are removed through CMP or the like, and the wiring 207 and the wiring 213 of the second wiring layer of the copper wiring having the dual damascene structure are formed. The wirings of the second wiring layer and plugs are formed through a dual damascene method. The wirings of the second wiring layer and plugs are formed while being respectively integrated. An upper surface of the wirings of the second wiring layer and an upper surface of the interlayer insulating film form one surface. Then, the diffusion prevention films 402 and 403 are formed on the first wiring layer, and the photoelectric conversion apparatus of FIG. 4C is obtained.

With the provision of the wiring layer and the plug having the damascene structure according to the present embodiment, it is possible to form the fine wiring (in terms of both the width and the thickness). Also, in the dual damascene structure, as the wiring layer and the plug are formed in the same step, for example, it is not necessary to provide a process margin in the CMP step for forming the plug, and it is possible to decrease the thickness of the interlayer insulating film by an amount corresponding to the process margin. Therefore, with the photoelectric conversion apparatus according to the present embodiment, while the increase in the capacitance of the FD section is suppressed, it is possible to decrease the thickness of the interlayer insulating film than the photoelectric conversion apparatus according to the first embodiment.

Also, in a case where the copper wiring is applied like the present embodiment, for the plugs 204, 205, and 210 arranged in the first interlayer insulating film 201, it is preferable to use a conductive material containing tungsten as a main component. If a conductive material containing copper as a main component is used for the plug for the connection with the semiconductor substrate, as a diffusion coefficient of copper is large, diffusion of copper into the semiconductor substrate occurs, which may cause a problem such as a dark current.

Third Embodiment

Figure 7A:
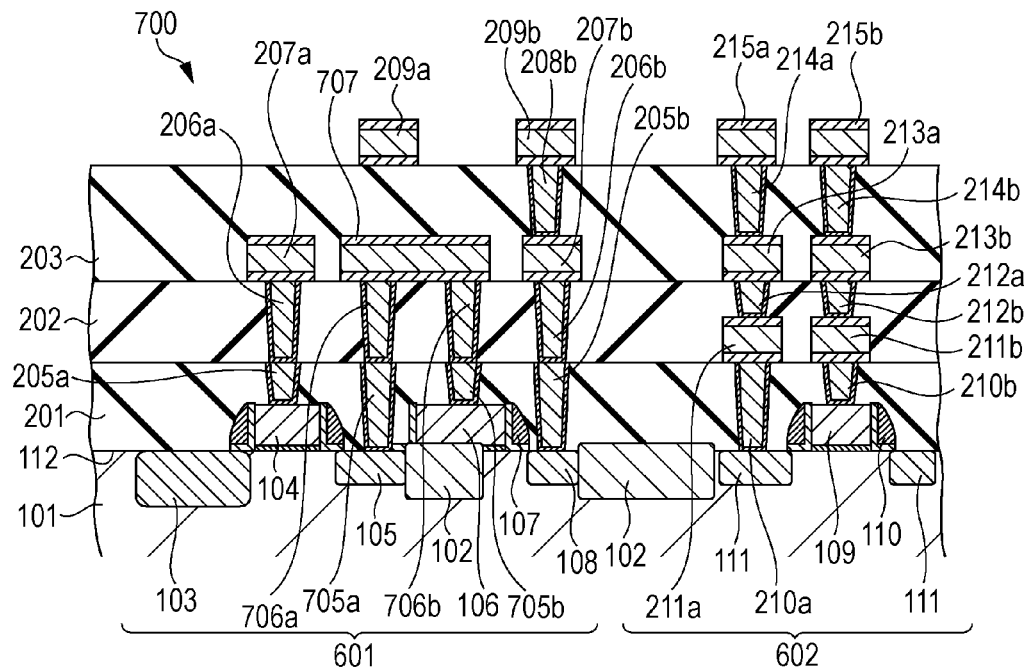
FIGS. 7A and 7B are cross sectional schematic diagrams of a photoelectric conversion apparatus according to a third embodiment of the present invention.

A photoelectric conversion apparatus according to the present embodiment has a configuration without using the shared contact structure according to the first embodiment. The photoelectric conversion apparatus according to the present embodiment will be described by using FIG. 7A. FIG. 7A is a drawing corresponding to FIG. 1, a similar configuration is assigned with the same reference numeral, and a description thereof will be omitted.

A photoelectric conversion apparatus 700 illustrated in FIG. 7A does not have the plug 204 having the shared contact structure of FIG. 1, and the FD section 105 and the gate electrode 106 of the amplification transistor are connected to each other with the stacked contact structure and the wiring. To be more specific, a plug 705a connected to the FD section 105 and a plug 705b connected to the gate electrode 106 of the amplification transistor are provided while being arranged in the first interlayer insulating film 201. Then, the plug 705a is connected to a plug 706a arranged in the second interlayer insulating film 202 which is connected to a wiring 707 included in the first wiring layer. The plug 705b is connected to a plug 706b arranged in the second interlayer insulating film 202 which is connected to the wiring 707 included in the first wiring layer. To elaborate, with the plug 705, the plug 706, and the wiring 707, the FD section 105 and the gate electrode 106 of the amplification transistor are electrically connected to each other. In the above-mentioned configuration too, similarly as in the first embodiment, while the increase in the capacitance of the FD section is suppressed and the step between the peripheral circuit area and the pixel area is reduced, it is possible to arrange more wiring layers in the peripheral circuit area than the pixel area.

Figure 7B:
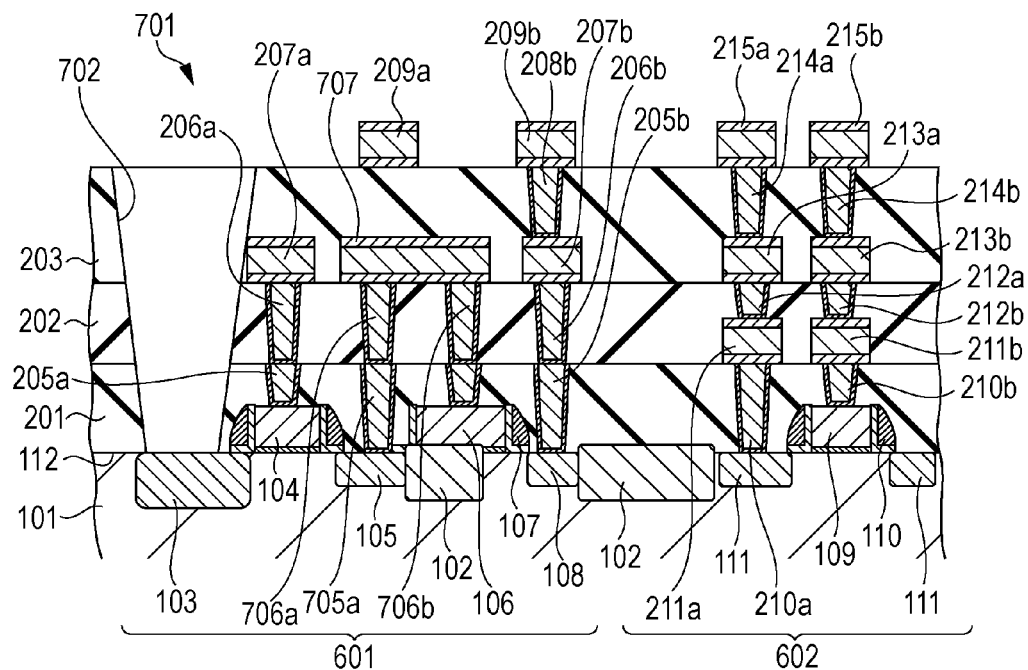

Also, a modified example of the present embodiment will be described by using FIG. 7B. A photoelectric conversion apparatus 701 of FIG. 7B is provided with an optical waveguide 702 on the photoelectric conversion element in addition to the configuration of FIG. 7A. With the above-mentioned configuration, it is possible to improve a collection efficiency of light. The optical waveguide 702 can be applied to configuration of other embodiments.

Application to Image Pickup System

Figure 8:
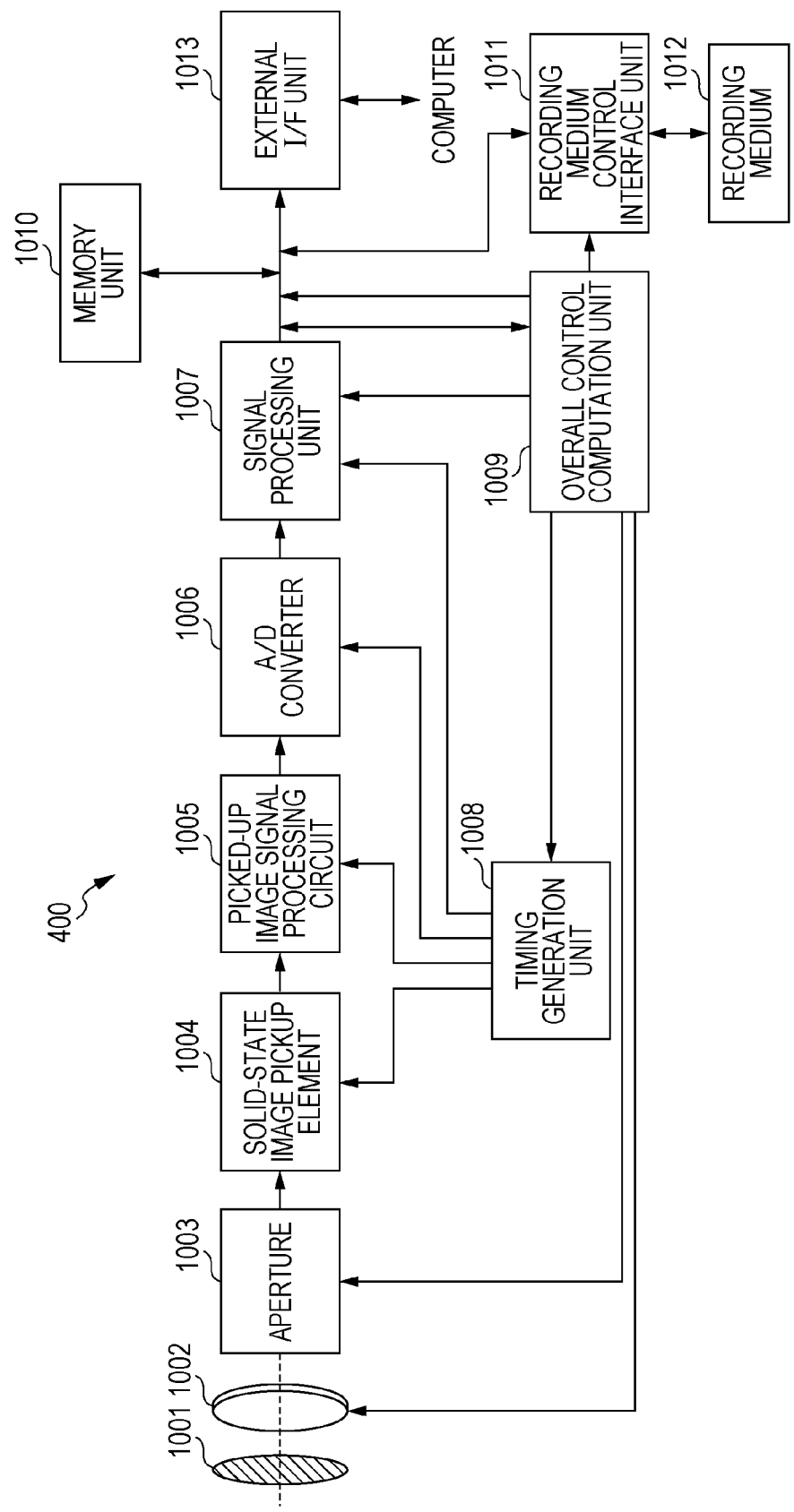
FIG. 8 is a block diagram for describing an image pickup system.

FIG. 8 illustrates a schematic configuration of a camera which is one of image pickup systems. It is noted that a concept of the camera includes not only an apparatus primarily intended to perform image pickup but also an apparatus provided with an image pickup function in an auxiliary manner (for example, a personal computer or a mobile terminal). A camera 400 is provided with a solid-state image pickup element 1004 represented by the photoelectric conversion apparatus 100 described above. An optical image of a subject is imaged on an image pickup surface of the solid-state image pickup element 1004 by a lens 1002. A barrier 1001 doubling as a protect function for the lens 1002 and a main switch may be provided on an outer side of the lens 1002. The lens 1002 may be provided with an aperture 1003 for adjusting a light amount of light exiting therefrom. Picked-up image signals output from the solid-state image pickup element 1004 are subjected to various corrections and processings such as clamping by a picked-up image signal processing circuit 1005. The picked-up image signals output from the picked-up image signal processing circuit 1005 are subjected to an analog/digital conversion by an A/D converter 1006. Image data output from the A/D converter 1006 is subjected to a signal processing such as a correction or a data processing by a signal processing unit 1007. The solid-state image pickup element 1004, the picked-up image signal processing circuit 1005, the A/D converter 1006, and the signal processing unit 1007 operate while following timing signals generated by a timing generation unit 1008.

The blocks 1005 to 1008 may be formed on the same chip as the solid-state image pickup element 1004. The respective blocks of the camera 400 are controlled by an overall control computation unit 1009. In addition to the above, the camera 400 is further provided with a memory unit 1010 for temporarily storing the image data and a recording medium control interface unit 1011 for recording an image to a recording medium or reading out. A recording medium 1012 is composed by including a semiconductor memory and the like and can be detachably attached. The camera 400 may also be provided with an external interface unit (I/F) unit 1013 for communicating with an external computer or the like.

Fourth Embodiment

Next, a fourth embodiment will be described. According to the embodiments described above, the number of wiring layers differs in the pixel area and the peripheral circuit area, but according to the present embodiment, the number of wiring layers becomes the same. According to the fourth embodiment, a configuration will be described in which the wiring of the first wiring layer is not arranged at least in the vicinity of the FD section and the stacked contact structure is applied. With the above-mentioned configuration, it is possible to suppress the increase in the capacitance of the FD section, and the decrease in the signal (decrease in the sensitivity) can be suppressed.

First, the capacitance of the FD section will be described. The FD section is connected to the gate electrode GAT of the amplification transistor and functions as an input section of the source follower circuit. A signal Vfd input to the source follower circuit is simply represented by Vfd=Qfd/Cfd by using a capacitance Cfd of the node FD including the FD section and a charge Qfd accumulated in the node FD. Therefore, if the capacitance of the FD section increases, the capacitance Cfd of the node FD increases, and the signal Vfd becomes small. At this time, when the first wiring layer used only for connecting the plug arranged in the first interlayer insulating film with the plug arranged in the second interlayer insulating film is formed in the vicinity of the FD section, the area of the wiring opposing the FD section increases. At this time, an electrostatic capacity between the FD section and the wiring increases. In view of the above-mentioned problem, according to the present embodiment, the stacked contact structure is applied while the wiring of the first wiring layer is not provided at least in the vicinity of the FD section.

Figure 9:
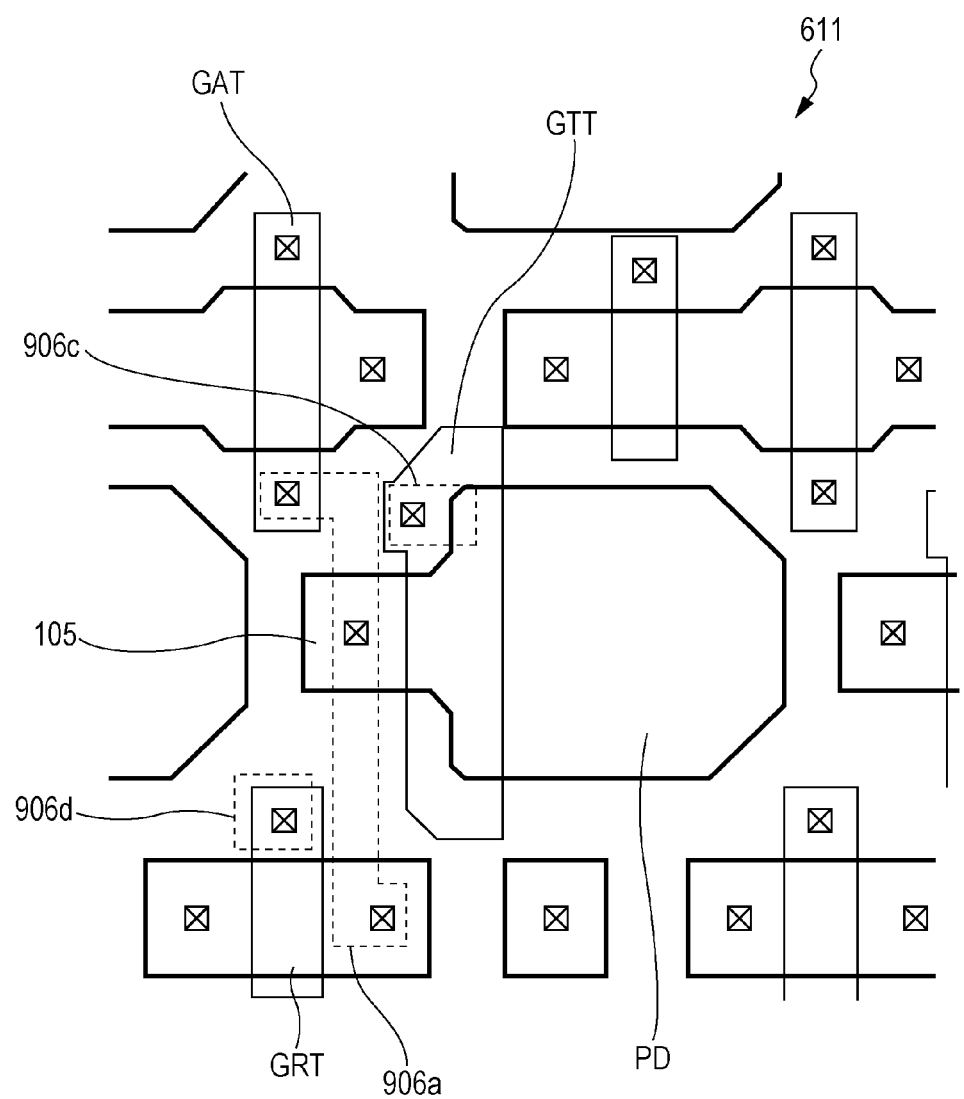
FIG. 9 is another plan schematic view of the pixel of the photoelectric conversion apparatus.

First, by using FIG. 9, a planar layout of a pixel circuit according to the present embodiment will be described. FIG. 9 illustrates another configuration of the planar layout diagram of the pixel circuit illustrated in FIG. 5B. In FIG. 9, the same configuration as that in FIG. 5B is assigned with the same reference numeral, and a description thereof will be omitted. In FIG. 9, a wiring 906 included in the first wiring layer is arranged. A wiring 906a is a wiring for connecting the FD section, the gate electrode GAT of the amplification transistor, and the drain of the reset transistor. A wiring 906c is a wiring for connecting the wiring included in the second wiring layer with the gate electrode GTT of the transfer transistor. A wiring 906d is a wiring for connecting the wiring included in the second wiring layer with an arbitrary semiconductor substrate.

Hereinafter, the photoelectric conversion apparatus according to the present embodiment will be described on the basis of the pixel 611 described above. It is noted that the circuit of the pixel and the planar layout of the present invention are not limited to the configurations illustrated in FIG. 9 and may also be a configuration including a selection transistor.

Figure 10:
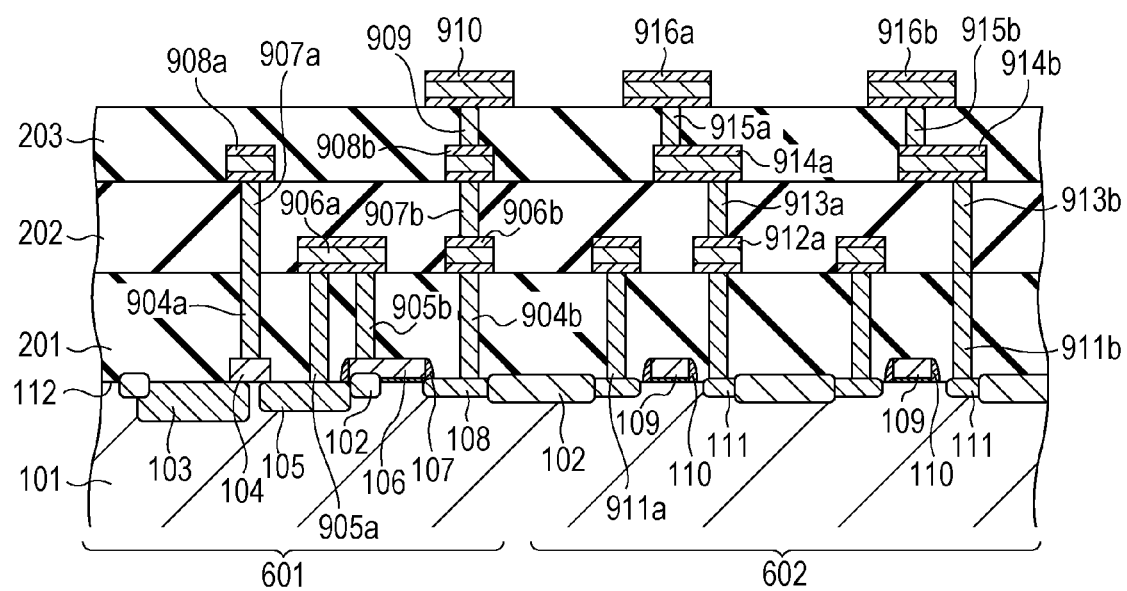
FIG. 10 is a cross sectional schematic diagram of a photoelectric conversion apparatus according to a fourth embodiment of the present invention.

The photoelectric conversion apparatus according to the present embodiment will be described by using FIG. 10. FIG. 10 is a cross sectional schematic diagram according to FIG. 9, illustrating a modification example of the configuration illustrated in FIG. 7A. A description of a similar configuration to that in FIG. 7A and FIG. 9 will be omitted.

In the pixel area 601 and the peripheral circuit area 602 of FIG. 10, the wiring section is arranged above the main surface 112 of the semiconductor substrate 101. In the pixel area 601 and the peripheral circuit area 602, the wiring section has the plurality of interlayer insulating films, the plurality of plugs, and the plurality of wiring layers. The plurality of plugs include the plugs arranged in the first interlayer insulating film 201, the plugs arranged in the second interlayer insulating film 202, and the plugs arranged in the third interlayer insulating film 203. The plugs arranged in the first interlayer insulating film 201 are plugs 904a, 904b, 905a, 905b, 911a, and 911b. The plugs arranged in the second interlayer insulating film 202 are plugs 907a, 907b, 913a, and 913b. The plugs arranged in the third interlayer insulating film 203 are plugs 909 and 915. The plurality of wiring layers have the first wiring layer arranged on the first interlayer insulating film 201, the second wiring layer arranged on the second interlayer insulating film 202, and the third wiring layer arranged on the third interlayer insulating film 203. The first wiring layer has wirings 906a, 906b, and 912, the second wiring layer has wirings 908 and 914, and the third wiring layer has wirings 910 and 916a.

Herein, FIG. 10 is different in the connection structure between the FD section and the gate electrode 106 of the amplification transistor as compared with the configuration of FIG. 7A, and the connection structure between the source/drain 111 of the transistor in the peripheral circuit area 602 and the wiring 914 of the second wiring layer is different. To be more specific, in FIG. 10, the FD section and the gate electrode 106 of the amplification transistor are connected to each other by the wiring 906b of the first wiring layer instead of the wiring of the second wiring layer. Also, the source/drain 111 is connected to the wiring 914b of the second wiring layer via the plugs 911b and 913b without the intermediation of the wiring of the first wiring layer. Also, in FIG. 10 too, similarly as in FIG. 7A, with regard to the plug 905a in the vicinity of the FD section 105, the stacked contact structure is formed for the connection with the plug 907a arranged in the second interlayer insulating film 202 without the intermediation of the first wiring layer. Herein, the vicinity of the FD section 105 means an area which surrounds the FD section, is adjacent to the FD section 105. For example, an area above the gate electrode GRT of the reset transistor and the gate electrode GTT of the transfer transistor in FIG. 9 is exemplified. To be more specific, by eliminating the wiring for the connection with the gate electrode of the transistor connected to the FD section, it is possible to suppress the increase in the capacitance. With the above-mentioned configuration, the increase in the capacitance of the FD section 105 can be reduced, and it is possible to suppress and the decrease in the signal (decrease in the sensitivity).

Also, in a case where the wiring of the first wiring layer is formed which is only used for connecting the plug arranged in the first interlayer insulating film with the plug arranged in the second interlayer insulating film, as it is necessary to secure the area for forming the wiring of the first wiring layer, it is difficult to advance the miniaturization. Therefore, with the configuration according to the present embodiment, the miniaturization can be facilitated.

Also, as the wiring of the first wiring layer only used for connecting the plug arranged in the first interlayer insulating film with the plug arranged in the second interlayer insulating film can be eliminated, it is possible to shorten, for example, an area where the wirings in the first wiring layer face each other, that is, a wiring facing length. Therefore, the number of detect generations caused by the short circuit can be decreased.

Also, as illustrated in the third embodiment, the stacked contact structure may be applied in an area that is not in the vicinity of the FD section 105. With the above-mentioned configuration, the realization of a low profile and the reduction in the number of detect generations caused by the short circuit between the wirings can be achieved.

It is noted that in FIG. 10, the stacked contact structure is provided in which the plug 911b that is a part of the peripheral circuit area 602 is not connected to the wiring of the first wiring layer arranged in the first interlayer insulating film 201 but is directly connected to the plug 913b arranged in the second interlayer insulating film 202. In this manner, a configuration may be adopted that the stacked contact structure exists in a mixed manner in the peripheral circuit area 602. In particular, the configuration is preferably applied to the area where the increase in the electrostatic capacity is not desired in the peripheral circuit area 602, for example, an amplification unit or the like.

Next, an exemplary manufacturing method for the photoelectric conversion apparatus of FIG. 10 will be described by using FIGS. 11A to 11E. Reference symbols in FIGS. 11A to 11E correspond to FIG. 10, and a description of a configuration assigned with the same reference symbol will be omitted. Also, a description of the same processing as the manufacturing method according to the first embodiment (FIGS. 3A to 3E) will be omitted.

Figure 11A:
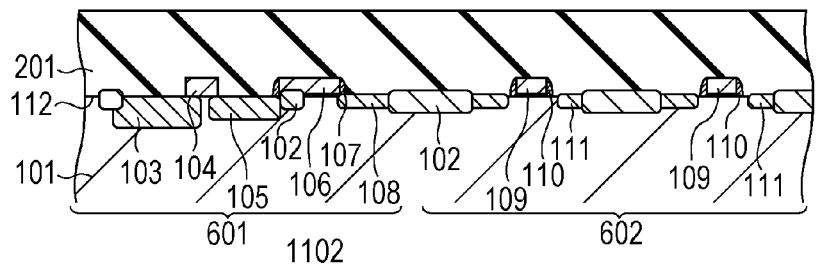
FIGS. 11A to 11E are cross sectional schematic diagrams illustrating a manufacturing procedure for the photoelectric conversion apparatus according to the fourth embodiment.

Elements including the element separation section 102, the gate electrodes 104, 106, and 109 of the transistor, the side walls 107 and 110, and the charge accumulation section 103 of the photo diode are formed by using the general semiconductor process. The interlayer insulating film 201 including a silicon oxide film is formed on the element formed in this manner, and a configuration illustrated in FIG. 11A is obtained. It is noted that similarly as in the description on the first embodiment, the interlayer insulating film 201 that becomes the first interlayer insulating film later and the first interlayer insulating film 201 are assigned with the same reference numeral for simplicity. The same applies to the other interlayer insulating films.

Figure 11B:
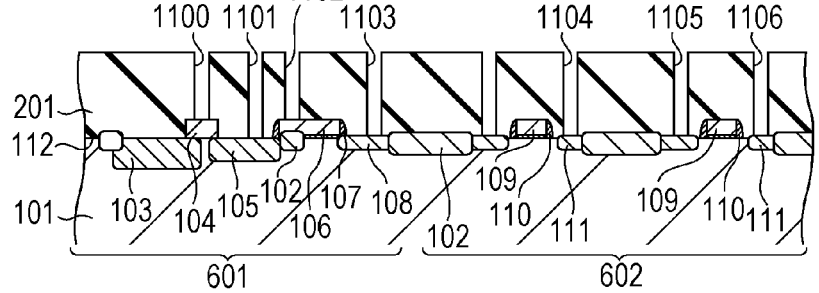
Figure 11C:
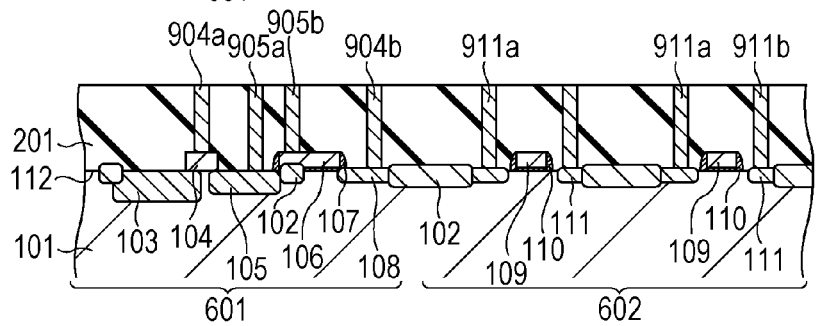

Next, by performing etching on the interlayer insulating film 201, contact holes 1110 to 1106 for the respective plugs illustrated in FIG. 10 are formed in the interlayer insulating film 201 (FIG. 11B). Then, the plugs 904a, 904b, 905a, 905b, 911a, and 911b are formed in the respective contact holes, and a configuration illustrated in FIG. 11C is obtained.

Figure 11D:
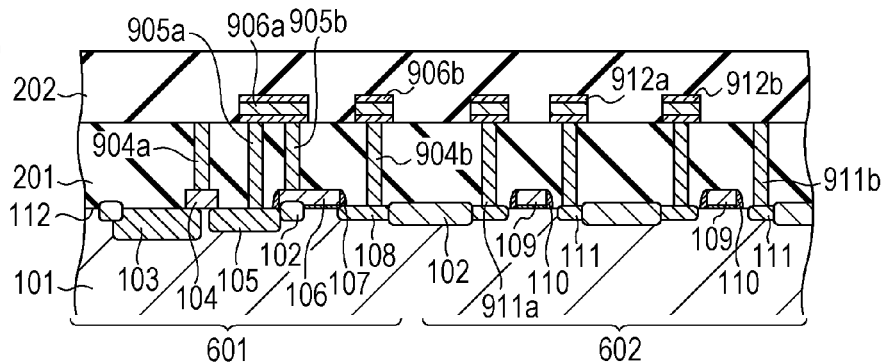

Next, the wirings 906a, 906b, and 912a of the first wiring layer are formed as illustrated in FIG. 11D. While covering an upper section thereof, for example, the insulating film 202 including a silicon oxide film is formed, and by performing the flattening processing, a structure illustrated in FIG. 11D is obtained.

Figure 11E:
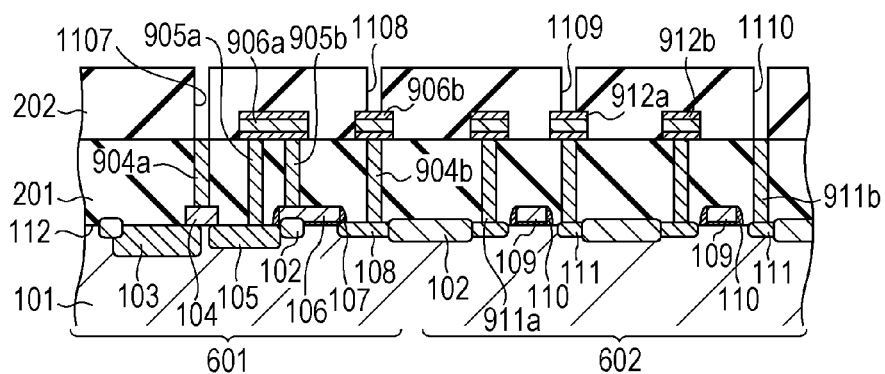

Next, by etching the insulating film 202, a configuration illustrated in FIG. 11E is obtained. In FIG. 11E, a via hole 1107 for exposing an upper surface of the plug 904a is formed on a part of the plug 904a in the pixel area 601. Also, a via hole 1108 on a section other than the plug 904a is formed on an upper section of the wiring 906b of the first wiring layer in a state in which an upper surface of the wiring 906b is exposed. Then, a via hole 1110 for exposing an upper surface of the plug 911a is formed on a part of the plug 911a in the peripheral circuit area 602. Also, a via hole 1109 on a section other than the plug 911b is formed on an upper section of the wiring 212 of the first wiring layer in a state in which an upper surface of the wiring 212 is exposed. Then, similarly as in FIG. 11C, the plugs 907a and 907b and the plugs 913a and 213b are formed. After that, the wiring of the second wiring layer illustrated in FIG. 10, the third interlayer insulating film 203, the plug 909, the plug 915a, and the like, and the wiring 910, the wiring 916a, and the like of the third wiring layer are formed, so that the structure illustrated in FIG. 10 is obtained.

After that, when requested, the plug, the wiring layer, and the interlayer insulating film are further formed, and the passivation film, the color filter, and the micro lens are arranged, so that the photoelectric conversion apparatus. Then, a stacked via structure may be applied to the further formed plug arranged in the interlayer insulating film and the wiring layer arranged on the interlayer insulating film. As described above, with the photoelectric conversion apparatus according to the present embodiment, it is possible to reduce the capacitance of the FD section. According to the present embodiment, the numbers of the wiring layers in the pixel area and the peripheral circuit area may be equal to each other or thus do not have a restriction.

Fifth Embodiment

Figure 12A:
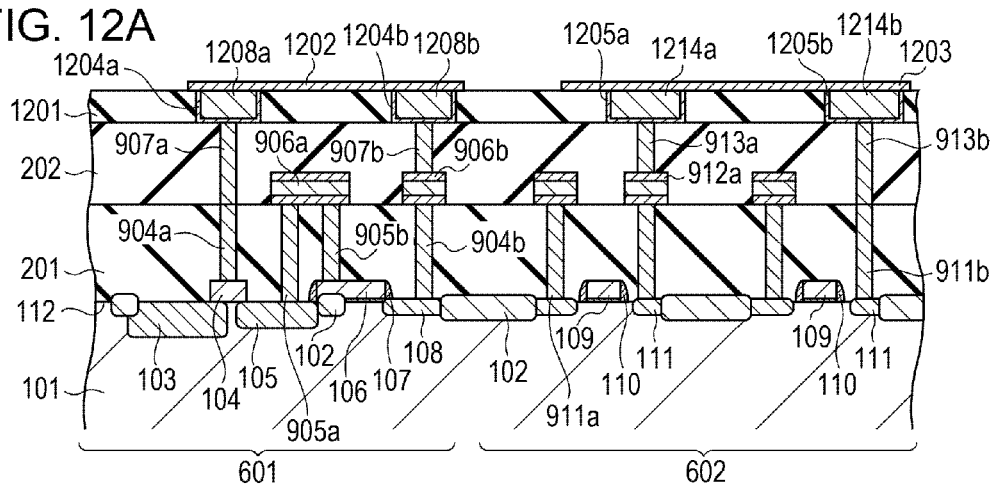
FIGS. 12A to 12C are cross sectional schematic diagrams of a photoelectric conversion apparatus according to a fifth embodiment of the present invention.
Figure 12B:
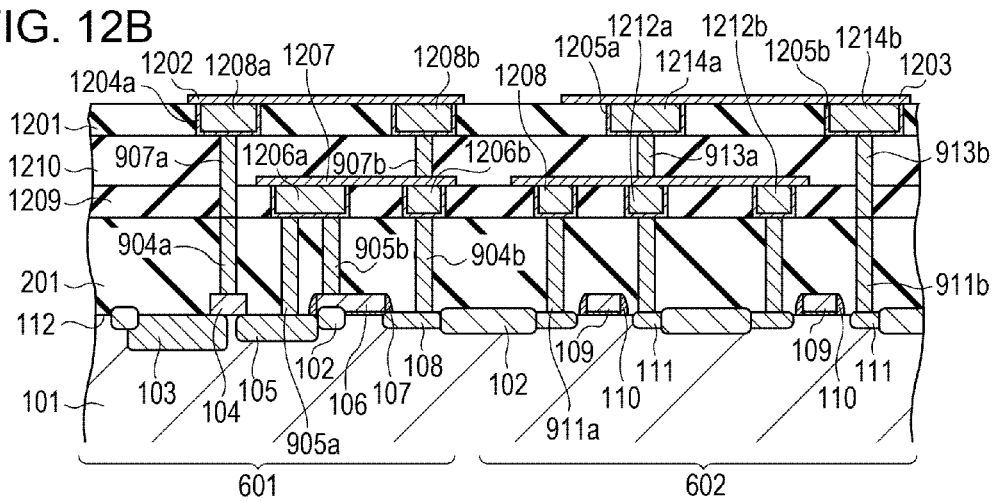
Figure 12C:
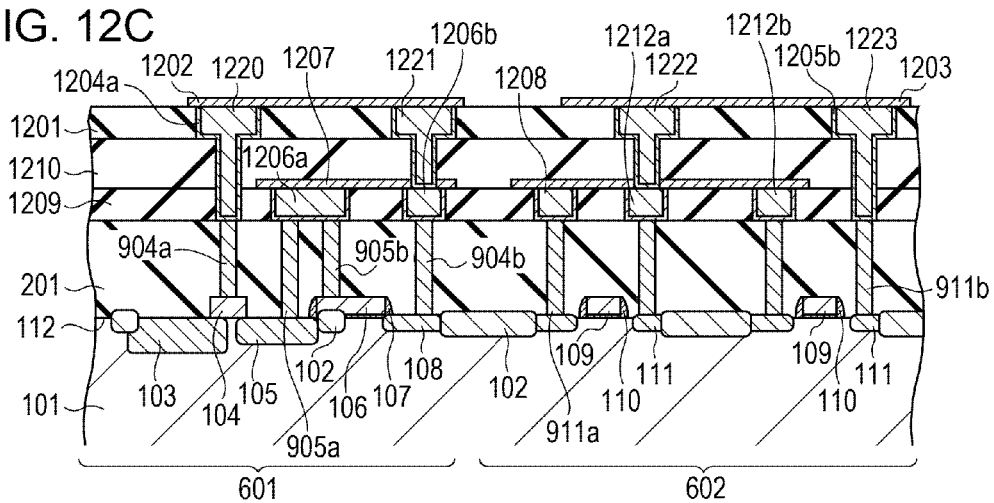

The present embodiment relates to a configuration in which various damascene structures are applied to the wiring layers according to the fourth embodiment similarly as in the second embodiment. The present embodiment will be described by using FIGS. 12A to 12C. FIGS. 12A to 12C are cross section schematic diagrams of the photoelectric conversion apparatus. FIGS. 12A to 12C illustrate configurations corresponding to a section from the semiconductor substrate 101 of FIG. 10 to a part between the wiring 908 and the wiring 914 of the second wiring layer. In FIGS. 12A to 12C, a similar configuration to that of FIG. 10 is assigned with the same reference numeral, and a description thereof will be omitted. Also, the damascene structure is similar to that of the second embodiment. With the provision of the wiring layer and the plug having the damascene structure according to the present embodiment, it is possible to form the fine wiring (in terms of both the width and the thickness), and the degree of freedom in the wiring layout can be further improved. Also, as compared with the photoelectric conversion apparatus according to the fourth embodiment, it is possible to decrease the thickness of the interlayer insulating film.

First, in the photoelectric conversion apparatus of FIG. 12A, the wiring 908 of the second wiring layer in the pixel area 601 of FIG. 10 and the wiring 914 in of the second wiring layer the peripheral circuit area 602 of FIG. 10 have the single damascene structure. A wiring 1208 and a wiring 1214 having the single damascene structure has copper as the conductive material and are so-called copper wirings. Then, copper diffusion prevention films 1202 and 1203 are arranged above the wiring 1208 and the wiring 1214.

With regard to the manufacturing method for the photoelectric conversion apparatus of FIG. 12A, a different part from the fourth embodiment will be described. Similarly as in the fourth embodiment, after up to the plugs 907a and 907b and the plugs 913a and 913b are formed, an interlayer insulating film 1201 is formed on the second interlayer insulating film 202. Then, in the interlayer insulating film 1201, the wiring groove for the second wiring layer is formed through etching or the like. Next, the film made of the barrier metal such as titanium nitride is formed. The inner wall of the wiring groove is covered and an upper surface of the interlayer insulating film 1201 is covered by the film made of the barrier metal. After that, the film made of copper is formed. The wiring groove where the film made of the barrier metal is arranged is buried and the upper surface of the interlayer insulating film 1201 where the film made of the barrier metal is formed is covered by the film made of copper. The film made of the barrier metal and the film made of copper formed in sections other than the wiring groove are removed through CMP or the like, and the copper wiring is formed. In FIGS. 12A to 12C, reference numerals 1204a, 1204b, 1205a, and 1205b denote barrier metals. Finally, a copper diffusion prevention film made of a silicon nitride film is formed so as to cover the top of the copper wiring, and when requested, the diffusion prevention film is patterned, so that the photoelectric conversion apparatus illustrated in FIG. 12A is obtained. After this, the wiring layer and the plug may be formed until a desired configuration is obtained. At that time, the formation may also be carried out by using the dual instead of the single damascene.

In the photoelectric conversion apparatus of FIG. 12B, in addition to the configuration of FIG. 12A, wirings 1206 and 1212 of the first wiring layer have the single damascene structure. The manufacturing method of FIG. 12B is almost similar to the cases of FIG. 12A and FIG. 4B, and a description thereof will be omitted. In FIG. 12B, diffusion prevention films 1207 and 1208 are arranged on the wiring of the first wiring layer. Also, reference numerals 1209 and 1210 denote interlayer insulating films.

Next, in the photoelectric conversion apparatus of FIG. 12C, the wiring 912 of the first wiring layer has the single damascene structure like FIG. 12B. Then, in the photoelectric conversion apparatus of FIG. 12C, wirings 1208a and 1208b of the second wiring layer and the plugs 907a and 907b in FIG. 12B have dual damascene structures 1220 and 1221. Also, wirings 1214a and 1214b and plugs 1213a and 1213b have dual damascene structures 1222 and 1223. The manufacturing method of FIG. 12C is similar to those of FIG. 12B and FIG. 4C, and a description thereof will be omitted.

With the provision of the wiring layer and the plug having the damascene structure according to the present embodiment, it is possible to form the fine wiring (in terms of both the width and the thickness). Also, in the dual damascene structure, as the wiring layer and the plug are formed in the same step, for example, it is not necessary to provide a process margin in the CMP step for forming the plug, and it is possible to decrease the thickness of the interlayer insulating film by an amount corresponding to the process margin. Therefore, with the photoelectric conversion apparatus according to the present embodiment, as compared with the photoelectric conversion apparatus according to the first embodiment, it is possible to further decrease the thickness of the interlayer insulating film.

Also, in a case where the copper wiring is applied like the present embodiment, a conductive material containing tungsten as a main component is preferably used for the plugs 904a, 904b, 905a, 905b, 911a, and 211b arranged in the first interlayer insulating film 201. If a conductive material containing copper as a main component is used for the plug for the connection with the semiconductor substrate, as a diffusion coefficient of copper is large, diffusion of copper into the semiconductor substrate occurs, which may cause a problem such as a dark current.

Sixth Embodiment

Figure 13A:
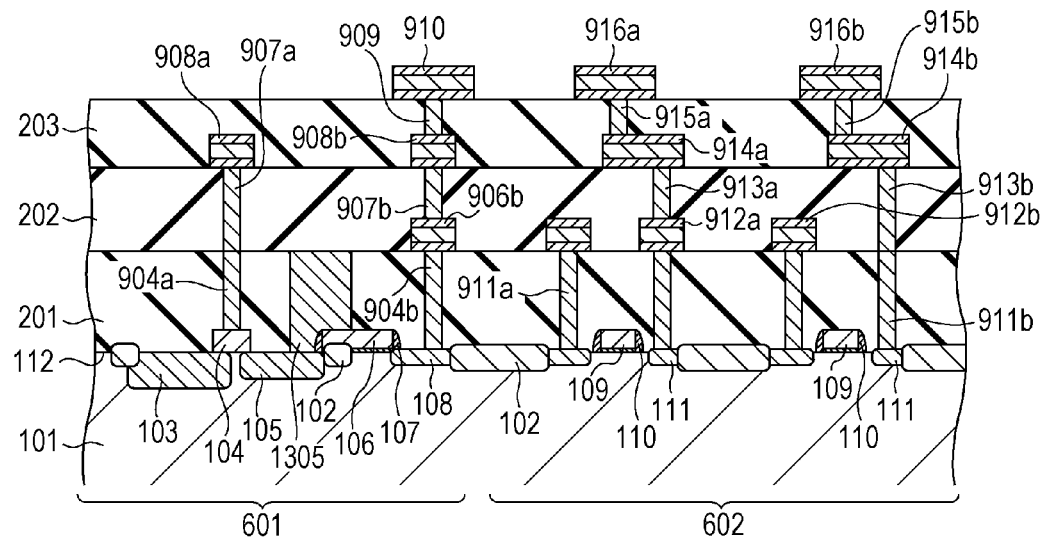
FIGS. 13A and 13B are cross sectional schematic diagrams of a photoelectric conversion apparatus according to a sixth embodiment of the present invention.

A photoelectric conversion apparatus according to the present embodiment has a configuration in which the shared contact structure is used according to the fourth embodiment. Herein, the shared contact structure is a structure in which the plugs 905a and 905b arranged in the first interlayer insulating film 201 in FIG. 10 electrically connect the FD section 105 with the gate electrode 106 of the amplification transistor without the intermediation of the wiring 906b. The photoelectric conversion apparatus according to the present embodiment will be described by using FIG. 13A. FIG. 13A is a drawing corresponding to FIG. 10, and a similar configuration is assigned with the same reference numeral, and a description thereof will be omitted.

The photoelectric conversion apparatus illustrated in FIG. 13A has a plug 1305 of the shared contact structure, and the plug 1305 connects the FD section 105 with the gate electrode 106 of the amplification transistor. To elaborate, the plug 1305 electrically connects the FD section 105 with the gate electrode 106 of the amplification transistor. In the above-mentioned configuration too, similarly as in the other embodiments, a stacked contact structure can be formed. Furthermore, by using the shared contact structure, stacked contact the FD section can be eliminated, and it is possible to reduce the capacitance of the FD section.

Also, a modified example of the present embodiment will be described by using FIG. 13B. The photoelectric conversion apparatus of FIG. 13B has a configuration in which the number of the wiring layers in the peripheral circuit area is larger as compared with the pixel area in the configuration of FIG. 13A. With the above-mentioned configuration, it is possible to increase only the number of the wiring layers in a peripheral circuit section where the larger scale of the circuit is prominent, and also a distance between the semiconductor substrate in the pixel area and the closest wiring can be maintained, which leads to the improvement in the sensitivity. Also, the structure in which only the number of the wiring layers in the peripheral circuit section in this manner is increased can be realized even when the shared contact structure is not used (not illustrated).

Figure 13B:
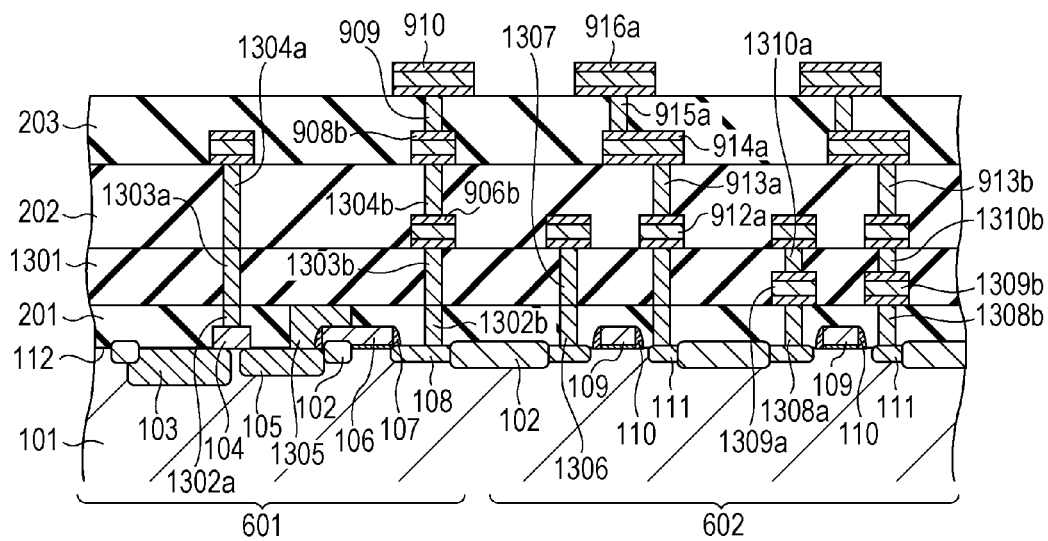

Also, the stacked contact structure is not limited to two plugs, and a configuration may also be provided in which three or more plugs like plugs 1302, 1303, and 1304 illustrated in FIG. 13B are directly connected. Also, in the peripheral circuit section, connections (1308 to 1310) via wirings and the stacked contact structures (1306 and 1307) may exist in a mixed manner. Furthermore, the stacked contact structure may be configured by not only the plugs arranged in the first interlayer insulating film and the second interlayer insulating film but also the plugs arranged in the second interlayer insulating film and the third interlayer insulating film. The same applies to the other embodiments.

The present invention can be applied to the photoelectric conversion apparatus having not only to the CMOS type photoelectric conversion apparatus but also the plurality of wiring layers. Also, the plugs of the shared contact structure illustrated in some of the embodiments may be arranged in the peripheral circuit area. Furthermore, according to the present invention, as a section for suppressing the increase in the capacitance, the vicinity of the FD section has been described, but it is possible to apply to an arbitrary section such as a section in the vicinity of the peripheral circuit section or the like where the increase in the capacitance is not desired.

The configurations of the respective embodiments of the present invention described above can be appropriately modified, and a combination thereof can also be used. Also, the photoelectric conversion apparatus described according to the fourth to sixth embodiments can of course be applied to the image pickup system.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-070328 filed Mar. 25, 2010 and No. 2011-055342 filed Mar. 14, 2011, which are hereby incorporated by reference herein in their entirety.

What is claimed is:

1. A photoelectric conversion apparatus comprising:
a semiconductor substrate having arranged thereon a pixel area, where a plurality of pixels including a photoelectric conversion element and a transistor are arranged, and a peripheral circuit area that has a transistor; and
a wiring section that is arranged on the semiconductor substrate, that has a plurality of interlayer insulating films including a first interlayer insulating film and a second interlayer insulating film arranged above the first interlayer insulating film, and that has a plurality of wiring layers including a first wiring layer and a second wiring layer arranged above the first wiring layer,
wherein the wiring section has a first plug arranged in the first interlayer insulating film and has a second plug arranged in the second interlayer insulating film,
wherein, in the peripheral circuit area, the wiring section has the first wiring layer and the first plug,
wherein the first plug connects to the first wiring layer in the peripheral circuit area,
wherein, in the pixel area, the wiring section has the second wiring layer, the first plug, and the second plug,
wherein the second plug connects to the second wiring layer in the pixel area,
wherein, in the peripheral circuit area, a wiring layer that is arranged in closest proximity to the semiconductor substrate is the first wiring layer, and
wherein, in the pixel area, the wiring layer that is arranged in closest proximity to the semiconductor substrate is the second wiring layer.

2. The photoelectric conversion apparatus according to claim 1,
wherein the first plug and the second plug have a stacked contact structure while being mutually in contact and stacked.

3. The photoelectric conversion apparatus according to claim 2,
wherein a pixel includes a transfer transistor for transferring a charge generated in the photoelectric conversion element and includes an amplification transistor for amplifying the charge, and
wherein the wiring section has plugs of a shared contact structure that connect a floating diffusion section, where the transfer transistor transfers the charge with a gate electrode of the amplification transistor, in the pixel area on the first interlayer insulating film.

4. The photoelectric conversion apparatus according to claim 3,
wherein at least a part of the first wiring layer is arranged above a plug of the shared contact structure and is arranged above the floating diffusion section.

5. The photoelectric conversion apparatus according to claim 1,
wherein the first plug and the second plug are formed of a barrier metal film and a conductive material,
wherein a material for the barrier metal film includes one of titanium, tantalum, silicon, and tungsten, and
wherein a material for the conductive material includes tungsten.

6. The photoelectric conversion apparatus according to claim 1,
wherein a material for the plurality of wiring layers includes copper or aluminum.

7. The photoelectric conversion apparatus according to claim 1,
wherein the wiring section has the second plug connected to the second wiring layer in the peripheral circuit area, and
wherein the second plug in the pixel area is longer than the second plug in the peripheral circuit area.

8. The photoelectric conversion apparatus according to claim 1,
wherein the photoelectric conversion apparatus has an optical black area for obtaining a reference signal, which has a pixel where light is shielded,
wherein the wiring section in the optical black area has the first wiring layer and the first plug connected to the first wiring layer, and
wherein the wiring layer arranged in closest proximity to the semiconductor substrate in the optical black area is the first wiring layer.

9. The photoelectric conversion apparatus according to claim 3,
wherein at least a part of the second wiring layer is arranged above the plug of the shared contact structure and is arranged above the floating diffusion section.

10. The photoelectric conversion apparatus according to claim 1,
wherein a material for the plurality of wiring layers includes aluminum.

11. A photoelectric conversion apparatus comprising:
a semiconductor substrate having arranged thereon a pixel area, where a plurality of pixels are arranged, and a peripheral circuit area that includes a transistor, wherein each pixel of the plurality of pixels includes a respective photoelectric conversion element and a respective transistor; and
a wiring section that is arranged on the semiconductor substrate, wherein the wiring section includes a first interlayer insulating film and a second interlayer insulating film that is arranged above the first interlayer insulating film,
wherein the wiring section includes a first wiring layer and a second wiring layer that is arranged above the first wiring layer,
wherein the wiring section has a first plug arranged in the first interlayer insulating film and has a second plug arranged in the second interlayer insulating film,
wherein, in the peripheral circuit area, the wiring section has the first wiring layer and the first plug,
wherein the first plug connects to the first wiring layer in the peripheral circuit area, wherein, in the pixel area, the wiring section has the second wiring layer, the first plug, and the second plug, wherein the second plug connects to the second wiring layer in the pixel circuit area, wherein, in the peripheral circuit area, the first wiring layer is closer to the substrate than any other wiring layer, and wherein, in the pixel area, the second wiring layer is closer to the substrate than any other wiring layer.

* * * * *